(12) United States Patent
Hong et al.

(10) Patent No.: US 10,552,362 B2
(45) Date of Patent: Feb. 4, 2020

(54) STORAGE DEVICE AND OPERATING METHOD THEREOF

(71) Applicant: Samsung Electronics Co., Ltd., Suwon-si, Gyeonggi-do (KR)

(72) Inventors: Boram Hong, Suwon-si (KR); Sung-Sun Kang, Hwaseong-si (KR); Otae Kwon, Seoul (KR); Min-Woo Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 273 days.

(21) Appl. No.: 15/052,175

(22) Filed: Feb. 24, 2016

(65) Prior Publication Data

US 2016/0358668 A1    Dec. 8, 2016

(30) Foreign Application Priority Data

Jun. 5, 2015   (KR) .................. 10-2015-0080048

(51) Int. Cl.
*G06F 13/42* (2006.01)
*G06F 13/16* (2006.01)
*G06F 11/07* (2006.01)

(52) U.S. Cl.
CPC ............ *G06F 13/42* (2013.01); *G06F 11/079* (2013.01); *G06F 11/0724* (2013.01); *G06F 13/1673* (2013.01)

(58) Field of Classification Search
CPC ............... G06F 11/079; G06F 11/0793; G06F 11/0724; G06F 11/0775
See application file for complete search history.

(56) References Cited

U.S. PATENT DOCUMENTS

| 7,679,133 | B2 | 3/2010 | Son et al. |
| 7,873,885 | B1 | 1/2011 | Shin et al. |
| 7,962,792 | B2* | 6/2011 | Diggs ...................... G06L 1/00 |
| | | | 714/27 |
| 8,086,919 | B2 | 12/2011 | Chen et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,718,967 | B2 | 5/2014 | Filler et al. |
| 8,732,552 | B2 | 5/2014 | Chu |
| 8,775,864 | B2 | 7/2014 | Brown et al. |
| 8,909,889 | B1 | 12/2014 | Ong et al. |
| 2004/0215948 | A1* | 10/2004 | Abbey ................. G06F 9/5077 |
| | | | 713/1 |

(Continued)

FOREIGN PATENT DOCUMENTS

KR      2014-0050549 A    4/2014
WO    WO-2012/091486 A1    7/2012

*Primary Examiner* — Jigar P Patel
(74) *Attorney, Agent, or Firm* — Harness, Dickey & Pierce, P.L.C.

(57) ABSTRACT

A storage device includes at least one nonvolatile memory device configured to store self-diagnosis firmware and a storage controller configured to communicate with an external device through a sideband interface. The storage controller is configured to perform self-diagnosis of the storage device using the self-diagnosis firmware according to the control of the external device. The storage controller is configured to transmit a result of the self-diagnosis to the external device through the sideband interface.

13 Claims, 15 Drawing Sheets

(56) References Cited

U.S. PATENT DOCUMENTS

| | | | | |
|---|---|---|---|---|
| 2006/0221393 A1* | 10/2006 | Takaki | ............... | G06F 11/1666 |
| | | | | 358/1.16 |
| 2008/0263345 A1* | 10/2008 | Booth | ................... | G06F 21/572 |
| | | | | 713/2 |
| 2011/0233648 A1 | 9/2011 | Seel et al. | | |
| 2012/0278662 A1* | 11/2012 | Gadsing | ............. | G06F 11/2221 |
| | | | | 714/42 |
| 2013/0124932 A1 | 5/2013 | Schuh et al. | | |
| 2013/0138383 A1 | 5/2013 | Filler et al. | | |
| 2014/0111557 A1 | 4/2014 | Omata et al. | | |
| 2014/0122931 A1 | 5/2014 | Devale et al. | | |
| 2014/0359196 A1 | 12/2014 | Ragland et al. | | |
| 2015/0039939 A1* | 2/2015 | Zhang | ................ | G06F 11/2284 |
| | | | | 714/36 |
| 2015/0212883 A1* | 7/2015 | Chen | .................. | G11C 11/5628 |
| | | | | 714/764 |
| 2015/0370665 A1* | 12/2015 | Cannata | ............... | G06F 3/0685 |
| | | | | 714/4.11 |

* cited by examiner

STORAGE DEVICE AND OPERATING METHOD THEREOF

CROSS-REFERENCE TO RELATED APPLICATIONS

This US non-provisional patent application claims priority under 35 USC § 119 to Korean Patent Application No. 10-2015-0080048, filed on Jun. 5, 2015, the entirety of which is hereby incorporated by reference.

BACKGROUND

The present disclosure relates to semiconductor memories and, more particularly, to nonvolatile memory systems and/or operating methods of the same.

Semiconductor memory device are memory devices implemented using a semiconductor such as silicon (Si), germanium (Ge), gallium arsenide (GaAs), and indium phosphide (InP). In general, semiconductor memory devices are classified into volatile memory devices and nonvolatile memory devices.

Volatile memory devices lose their stored data when their power supplies are interrupted. Nonvolatile memory devices may include a static RAM (SRAM), a dynamic RAM (DRAM), and a synchronous DRAM (SDRAM). Nonvolatile memory devices are memory that retain their stored data even when their power supplies are interrupted. Nonvolatile memory devices may include a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (RRAM), and a ferroelectric RAM (FRAM).

A flash memory device has been widely adopted as a storage medium in various fields of application. A high-capacity storage medium based on a flash memory device is called a solid state drive (SSD). AnSSD includes a plurality of semiconductor packages such as a controller package and a flash memory package, and the packages are mounted on a printed circuit board (PCB) to be connected to each other. Faults such as bad connection and an error caused by heat may occur while the semiconductor packages are mounted on the PCB. These faults may prevent the SSD from operating normally. Accordingly, various methods have been developed to detect the above-mentioned faults during manufacturing or assembling of an SSD.

SUMMARY

The present disclosure relates to a storage device that performs self-diagnosis in an on-board solid state drive (SSD) to detect a fault and an operating method of the storage device.

Example embodiments of inventive concepts provide a storage device. The storage device includes at least one nonvolatile memory device configured to store self-diagnosis firmware, and a storage controller configured to communicate with an external device through a sideband interface. The storage controller is configured to perform self-diagnosis using the self-diagnosis firmware according to the control of the external device, and the storage controller is configured to transmit a result of the self-diagnosis to the external device through the sideband interface.

In example embodiments, the sideband interface may include at least one of an I2C, a system management bus, and a management component transport protocol (MTCP).

In example embodiments, the storage controller is configured to perform the self-diagnosis by writing diagnosis data into the at least one nonvolatile memory device, reading the diagnosis data written into the at least one nonvolatile memory device, and comparing the read diagnosis data with the original diagnosis data.

In example embodiments, the storage controller may be configured to detect a calibrated configuration value according to the result of the self-diagnosis, and the calibrated configuration value includes hardware configuration values of the storage controller and the at least one nonvolatile memory device.

In example embodiments, the storage device may be an on-board solid state drive.

In example embodiments, the storage controller may be configured to store the calibrated configuration value in the at least one nonvolatile memory device.

In example embodiments, the at least one nonvolatile memory device may further be configured to store normal firmware, and the storage controller may be configured to perform a normal operation using the normal firmware at a power-on after performing the self-diagnosis.

In example embodiments, during the normal operation, the storage controller may be configured to load the calibrated configuration value and to adjust a hardware configured value of the at least one nonvolatile memory device based on the calibrated configuration value.

In example embodiments, the storage controller may be configured to adjust the hardware configuration values of the storage controller and the at least one nonvolatile memory device based on the calibration configuration value such that the hardware configuration values for the storage controller and the at least one nonvolatile memory device may be different from each other.

In example embodiments, the storage controller may include a buffer memory. The storage controller may be configured to load the self-diagnosis firmware from the at least one nonvolatile memory device and to store the loaded self-diagnosis firmware in the buffer memory.

In example embodiments, each of the at least one nonvolatile memory device and the storage controller may be a separate semiconductor package and may be mounted on a printed circuit board, and the at least one nonvolatile memory device and the storage controller may be configured to be electrically connected to each other through a plurality of interconnections on the printed circuit board.

In example embodiments, the external device may be a debugger device configured to test the storage device, and the storage controller may be electrically connected to a central processing unit through a plurality of interconnections on the printed circuit board and the storage controller may be configured to communicate with the central processing unit using a host interface.

In example embodiments, the at least one nonvolatile memory device may include a three-dimensional array.

Example embodiments of inventive concepts relate to an operating method of a storage device including at least one nonvolatile memory device and a storage controller configured to control the at least one nonvolatile memory device. The operating method includes loading self-diagnosis firmware included in the at least one nonvolatile memory device at initial booting of the storage device using the storage controller after the at least one nonvolatile memory device and the storage controller are mounted on a printed circuit board, performing self-diagnosis of the storage device, and transmitting a result of the self-diagnosis to an external device through a sideband interface. The performing the self-diagnosis includes executing the loaded self-diagnosis firmware.

In example embodiments, the method may further include controlling the initial booting of the storage device using the external device.

According to example embodiments of inventive concepts, a storage device includes a first nonvolatile memory device configured to store self-diagnosis firmware, a second nonvolatile memory device configured to store normal firmware, and a storage controller including a buffer memory. The storage controller is configured to control the storage device in a self-diagnosis mode using the self-diagnosis firmware for performing self-diagnosis of components in the storage device, the storage controller is configured to transmit a result of the self-diagnosis to an external device using a sideband interface, and the storage controller is configured to control the storage device in a normal mode using the normal firmware after performing the self-diagnosis if the storage device does not detect a fatal fault during the self-diagnosis.

In example embodiments, the sideband interface includes at least one of an I2C, a system management bus, and a management component transport protocol (MTCP).

In example embodiments, the first nonvolatile memory device, the second nonvolatile memory device, and the storage controller are on the circuit board, and the storage controller is configured to perform the self-diagnosis by writing diagnosis data into at least one of the first and second nonvolatile memory devices, reading the diagnosis data written into the at least one of the first and second nonvolatile memory devices, and comparing the read diagnosis data with the original diagnosis data.

In example embodiments, the storage controller is configured to detect a calibrated configuration value according to the result of the self-diagnosis, the calibrated configuration value includes hardware configuration values of the storage controller, the first nonvolatile memory device, and the second nonvolatile memory device, and during the normal mode, the storage controller is configured to load the calibrated configuration value and to adjust at least one of the hardware configuration values of at least one of the first nonvolatile memory device and the second nonvolatile memory device based on the calibrated configuration value.

In example embodiments, the first nonvolatile memory device, the second nonvolatile memory device, and the storage controller are connected to each other on the circuit board, and the storage controller is configured to perform the self-diagnosis by checking a connection state of at least one of a sensor, the external device, and a power management circuit connected to the storage controller.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
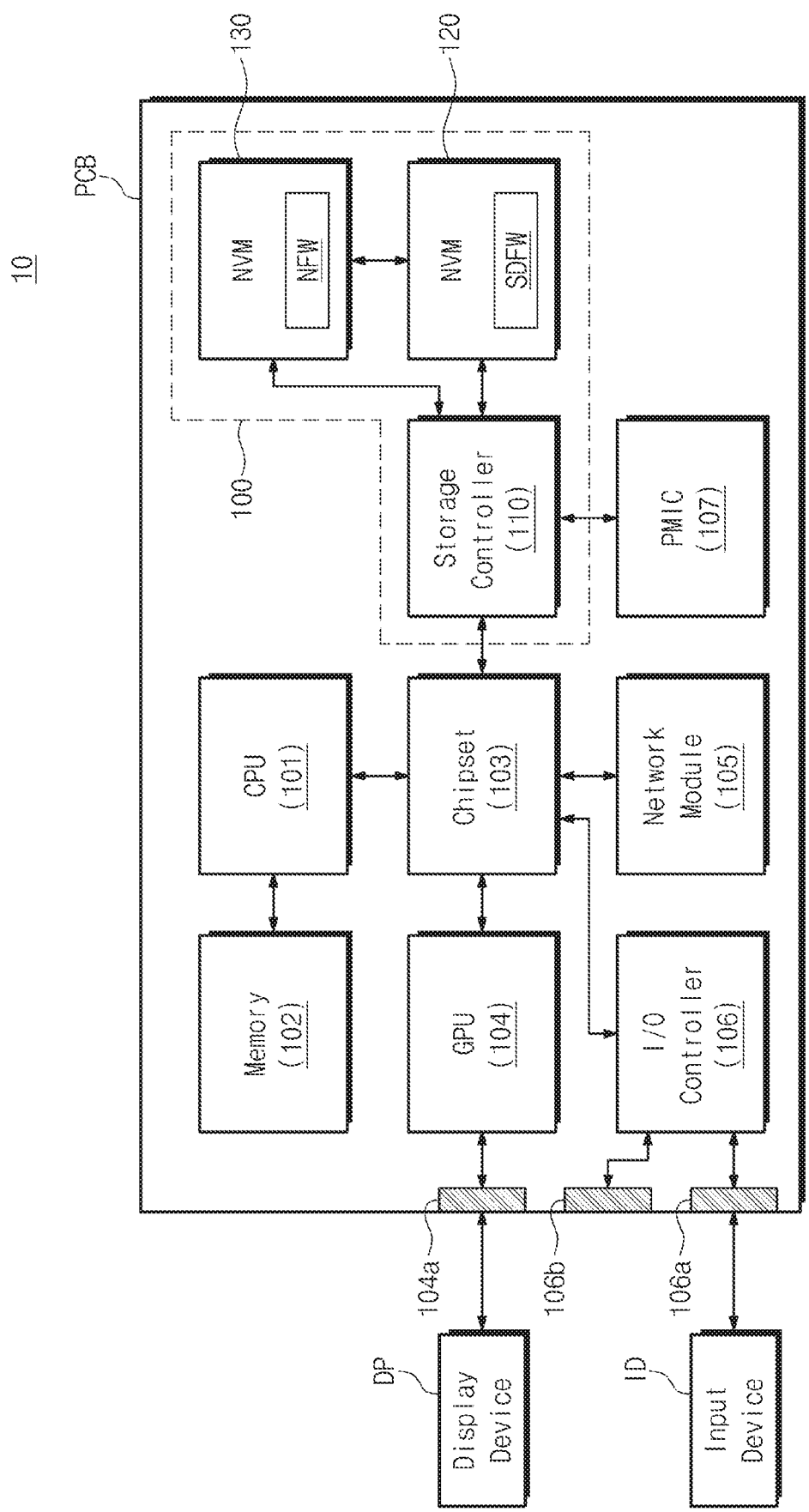
FIG. 1 is a block diagram of a computing system according to example embodiments of inventive concepts.

Example embodiments will now be described more fully with reference to the accompanying drawings, in which some example embodiments are shown. Detailed example embodiments of the inventive concepts are disclosed herein. However, specific structural and functional details disclosed herein are merely representative for purposes of describing example embodiments of inventive concepts. Example embodiments of inventive concepts may, however, be embodied in many alternate forms and should not be construed as limited to only the embodiments set forth herein. Example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

While example embodiments of the inventive concepts are capable of various modifications and alternative forms, embodiments thereof are shown by way of example in the drawings and will herein be described in detail. It should be understood, however, that there is no intent to limit example embodiments of inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a computing system 10 according to example embodiments of inventive concepts. In example embodiments, the computing system 10 may include at least one of a computer, a portable computer, an ultra-mobile PC (UMPC), a workstation, a net-book, a personal digital assistant (PDA), a web tablet, a wireless phone, a mobile phone, a digital camera, a digital audio recorder, a digital audio player, a digital video recorder, and a digital video player, a device capable of transmitting/receiving information in wireless environment, one of various electronic devices constituting a home network.

Referring to FIG. 1, the computing system 10 includes a printed circuit board (PCB), a display device (DP), and an input device (ID).

The PCB may be a mother board or a mainboard of the computing system 10. Various hardware used to and/or required to operate the computing system 10 may be mounted on the PCB. In example embodiments, the PCB may include regions on which various hardware components such as a semiconductor chip, a semiconductor package, a passive device, an active device, a control circuit, and an electronic circuit may be mounted. For example, storage controller 110 and first and second nonvolatile memory devices 120 and 130 may be mounted on a dedicated region provided to the PCB.

The PCB may include various interconnections. The various interconnections may electrically connect the hardware components mounted on the PCB. The hardware components mounted on the PCB may communicate with each other through the various interconnections.

Storage device 100, a central processing unit (CPU) 101, a memory 102, a chipset 103, a graphic process unit (GPU) 104, a network module 105, an input/output controller 106, a plurality of input/output sockets 106a to 106b, and a power management integrated circuit (PMIC) 107 included in the computing system 10 may be mounted in respective regions provided on the PCB. The input/output sockets 106a and 106b may also be referred to as connectors 106a and 106b.

The storage device 100 includes the storage controller 110 and the first and second nonvolatile memory devices 120 and 130. The storage controller 110 may control the first and second nonvolatile memory devices 120 and 130 according to the control of the CPU 101. For example, the storage controller 110 may read data stored in the first and second nonvolatile memory devices 120 and 130 according to the control of the CPU 101 or may store data in the first and second nonvolatile memory devices 120 and 130 according to the control of the CPU 101. In example embodiments, the storage controller 110 may communicate with the CPU 101 through the chipset 103.

The first and second nonvolatile memory devices 120 and 130 may operate according to the control of the storage controller 110. In example embodiments, the first and second nonvolatile memory devices 120 and 130 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM), and a spin-torque magnetic RAM (STT-MRAM). For brevity of description, an example will be described where each of the first and second nonvolatile memory devices 120 and 130 is a NAND flash memory device.

In example embodiments, the storage device 100 may be used as a high-capacity storage medium of the computing system 10. As described above, the storage controller 110 and the first and second nonvolatile memory devices 120 and 130 of the storage device 100 may be mounted on the PCB of the computing system 10. That is, the storage device 100 may be an on-board storage medium or an on-board SSD.

The CPU 101 may perform the overall operation used to and/or required to operate the computing system 10. For example, the CPU 101 may interpret a command input from a user and perform an operation or process data based on the interpreted command. The CPU 101 may output a result of the operation or the processed data.

The memory 102 may be used as a main memory of the computing system 10. The memory 102 may include a volatile random access memory such as DRAM (Dynamic Random Access Memory), SDRAM (Synchronous DRAM), DDR SDRAM (Double Data Rate SDRAM), DDR2 SDRAM, DDR3 SDRAM, LPDDR SDRAM (Low Power SDRAM), LPDDR2 SDRAM, and LPDDR3 SDRAM or a nonvolatile random access memory such as PRAM (Phase-change RAM), MRAM (Magnetic RAM), RRAM (Resistive RAM), and FRAM (Ferroelectric RAM). In example embodiments, the memory 102 may be mounted on the PCB and connected to the CPU 101 through the interconnections provided to the PCB.

The chipset 103 is a device to control various hardware components included in the computing system 10 according to the control of the CPU 101. For example, the chipset 103 may control the storage device 100, the GPU 104, the network module 105, and the input/output controller 106 according to the control of the CPU 101. In example embodiments, the chipset 103 may be mounted on the PCB and may be electrically connected to various hardware through interconnections provided to the PCB. In example embodiments, the chipset 103 may communicate with each of the various hardware via a desired (and/or alternatively predetermined) interface. In example embodiments, the desired (and/or alternatively predetermined) interface may include at least one of various interfaces such as USB (universal serial bus), MMC (multimedia card), embedded-MMC, PCI (peripheral component interconnection), PCI express, ATA (advanced technology attachment), serial-ATA, parallel-ATA, SCSI (small computer small interface), ESDI (enhanced small disk interface), IDE (integrated drive electronics), Firewire, and UFS (universal flash storage). However, example embodiments are not limited thereto.

The GPU 104 may convert the data processed by the CPU 101 or the result of the operation into an image signal. The converted image signal may be output to the display device DP. In example embodiments, the GPU 104 may be mounted on the PCB and may be connected to the chipset 103 and a connector 104a through interconnections provided on the PCB. Although not shown in the drawing, the GPU 104 may be included in the CPU 101. In example embodiments, the connector 104a may be connected to the display device DP.

The network module 105 supports wired and/or wireless communication with external devices. For example, the network module 105 may support wired and/or wireless communication such as CDMA (Code Division Multiple Access), GSM (Global System for Mobile communication), WCDMA (wideband CDMA), CDMA-2000, TDMA (Time Division Multiple Access), LTE (Long Term Evolution), Wimax, WLAN, UWB, Bluetooth, and WI-DI. In example embodiments, the network module 105 may be mounted on the PCB and may be connected to the chipset 103 through the interconnections provided on the PCB.

The input/output controller 106 may process information input from the input device ID included in the computing system 10 or may control connectors 106a and 106b. In example embodiments, the connectors 106a and 106b may include input/output terminals such as PS2 port, PCI slot, DIMM slot, USB terminal, RGB port, DVI port, and HDMI port. In example embodiments, the connectors 106a and 106b may be mounted on the PCB.

The power management integrated circuit (PMIC) 107 may supply power to various hardware of the computing system 10 based on externally supplied power. Although not shown in the drawing, the power management integrated circuit (PMIC) 107 may supply power only for the storage device 100 and may be integrated in the storage controller 110.

In example embodiments, the first and second nonvolatile memory devices 120 and 130 included in the storage device 100 may include (and/or be configured to include) self-diagnosis firmware (SDFW) and normal firmware (NFW), respectively. The self-diagnosis firmware (SDFW) may include information or a program used to and/or required to operate the storage device 100. In example embodiments, although not shown in the drawing, the self-diagnosis firmware (SDFW) and the normal firmware (NFW) may be stored together in the first and second memory devices 120 and 130 or may be stored in a separate storage medium. The separate storage medium may be mounted on the PCB.

The storage device 100 may perform self-diagnosis based on the self-diagnosis firmware (SDFW). For example, the storage controller 110 may load the self-diagnosis firmware (SDFW) and execute the loaded self-diagnosis firmware (SDFW) to perform self-diagnosis. In example embodiments, the self-diagnosis may indicate a series of operations to check assembling states of the first and second nonvolatile memory devices 120 and 130 or connection states of the respective first and second nonvolatile memory devices 120 and 130.

In example embodiments, the self-diagnosis of the storage device 100 may be performed during assembling of the computing system 10. For example, the storage device 100 may perform self-diagnosis based on the self-diagnosis firmware (SDFW) after the storage controller 110 and the first and second nonvolatile memory devices 120 and 130 of the storage device 100 are mounted on the PCB and before other hardware components (e.g., CPU, memory, GPU, etc.) are mounted on the PCB. That is, since a fault of the storage device 100 may be detected during assembling of the computing system 10, reliability of the storage device 100 may be assured. Thus, a storage device with improved reliability is provided.

Figure 2:
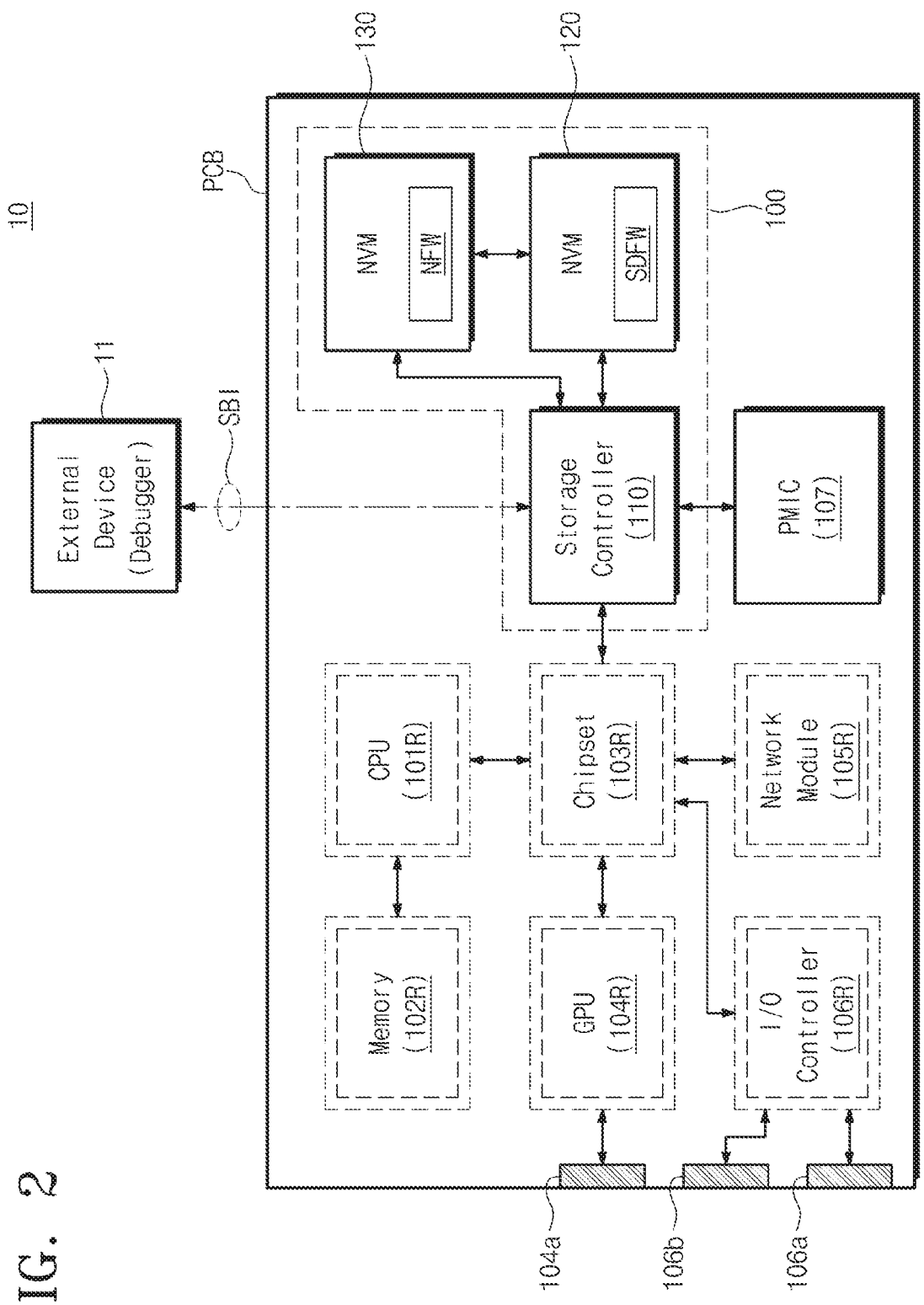
FIG. 2 is a block diagram illustrating the assembling procedure of the computing system in FIG. 1 and the operation of a storage device.

FIG. 2 is a block diagram illustrating the assembling procedure of the computing system 10 in FIG. 1 and the operation of a storage device. Referring to FIGS. 1 and 2, the computing system 10 may include a printed circuit board (PCB). As described with reference to FIG. 1, various hardware included in the computing device 10 may be mounted on dedicated regions included in the PCB, respectively. For example, the PCB may include a dedicated region 101R of the CPU 101, a dedicated region 102R of the memory 102, a dedicated region 103R of the chipset 103, a dedicated region 104R of the GPU 104, a mounting region 105R of the network module 105, and a mounting region 106R of the input/output controller 106. The mounting regions 105R and 106R may be electrically connected to each other through various interconnections provided to the PCB.

In example embodiments, the storage controller 110 and the first and second nonvolatile memory devices 120 and 130 of the storage device 100 may be mounted on dedicated regions provided on the PCB, respectively. In example embodiments, the storage controller 110 may be connected to an external device 11 (e.g., debugger) after the storage controller 110 and the first and second nonvolatile memory devices 120 and 130 of the storage device 100 are mounted on the PCB. The storage controller 110 may load self-diagnosis firmware (SDFW) according to the control of the external device 11 and execute the loaded self-diagnosis firmware (SDFW) to perform self-diagnosis. The storage controller 110 may transmit a result of the self-diagnosis to the external device 11.

In example embodiments, the storage controller 110 may transmit a result of the self-diagnosis to the external device 11 through a sideband interface (SBI). In example embodiments, the sideband interface (SBI) may include additionally provided communication interfaces other than a communication interface provided for a normal operation. In example embodiments, the sideband interface (SBI) may include I2C communication, management component transport protocol (MCTP), SMBus, etc. In example embodiments, the storage controller 110 and the external device 11 may be connected to each other not through the interconnections provided on the PCB but through separate interconnections. Although not shown in the drawings, the storage controller 110 and the external device 11 may be connected to each other through the external connectors 106a and 106b.

In example embodiments, the self-diagnosis firmware (SDFW) may include information for performing a series of operations to detect whether the storage device 100 or components included in the storage device 100 are faulty. The self-diagnosis firmware (SDFW) may include information for transmitting the self-diagnosis result to the external device 11.

In example embodiments, the storage device 100 may perform a self-diagnosis operation based on power from a power management integrated circuit 107.

Figure 3:
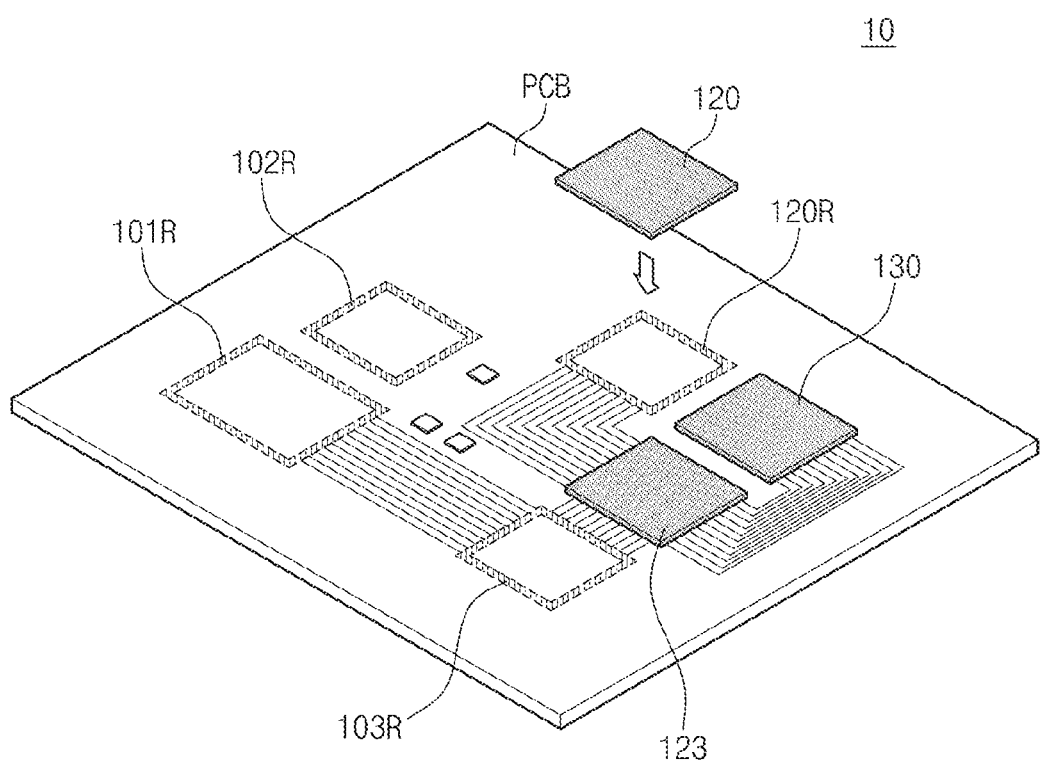
FIG. 3 is an example diagram of a printed circuit board in FIG. 2.

FIG. 3 is an example diagram of the printed circuit board (PCB) in FIG. 2. For brevity of the drawing, some components included in the computing system 10 are omitted. For brevity of the drawing, some dedicated regions included in the PCB in FIG. 2 are also omitted. Referring to FIGS. 2 and 3, as described above, the PCB may include dedicated regions on which various hardware components included in the computing system 10 are mounted. For example, the PCB may include a dedicated region 101R on which the CPU 101 is mounted, a dedicated region 102R on which the memory 102 is mounted, a dedicated region 103R on which the chipset 103 is mounted, and a dedicated region 120R on which the first nonvolatile memory device 120 is mounted. The dedicated regions 101R, 102R, 103R, and 120R may be electrically connected to each other through interconnections provided on the PCB. The storage controller 110 and the second nonvolatile memory device 130 may be mounted on their dedicated regions included in the PCB, respectively.

In example embodiments, the storage controller 110 and the first and second nonvolatile memory devices 120 and 130 may each be mounted on the PCB using a surface mounting technology (SMT). For example, the first nonvolatile memory device 120 may be mounted in the mounting region 120R on the PCB. In example embodiments, the storage controller 110 and the first and second nonvolatile memory devices 120 and 130 may each be implemented with a separate chip or package to be mounted on the PCB.

Although not shown in the drawings, the storage device 100 may further include nonvolatile memory devices other than the first and second nonvolatile memory devices 120 and 130. The storage controller 110 and the first and second nonvolatile memory devices 120 and 130 may be mounted different surfaces of the PCB, respectively. For example, the first nonvolatile memory device 120 may be mounted on a first surface of the PCB and the nonvolatile memory device 120 may be mounted on a second surface opposite to the first surface.

In example embodiments, the storage controller 110 and the first and second nonvolatile memory devices 120 and 130 of the storage device 100 may be connected to the external device 11 after being mounted on the PCB and may perform self-diagnosis according to the control of the external device 11. For example, when the storage controller 110 and the first and second nonvolatile devices 120 and 130 are mounted on the PCB according to the surface mounting technology (SMT), faults resulting from poor connection of the storage controller 110 and the first and second nonvolatile memory devices 120 and 130 or resulting from high temperature may occur. Before other hardware components are mounted on the PCB after the storage device 100 is mounted on the PCB, the storage device 100 may perform self-diagnosis to detect the above faults. Thus, a storage device with improved reliability is provided.

Figure 4:
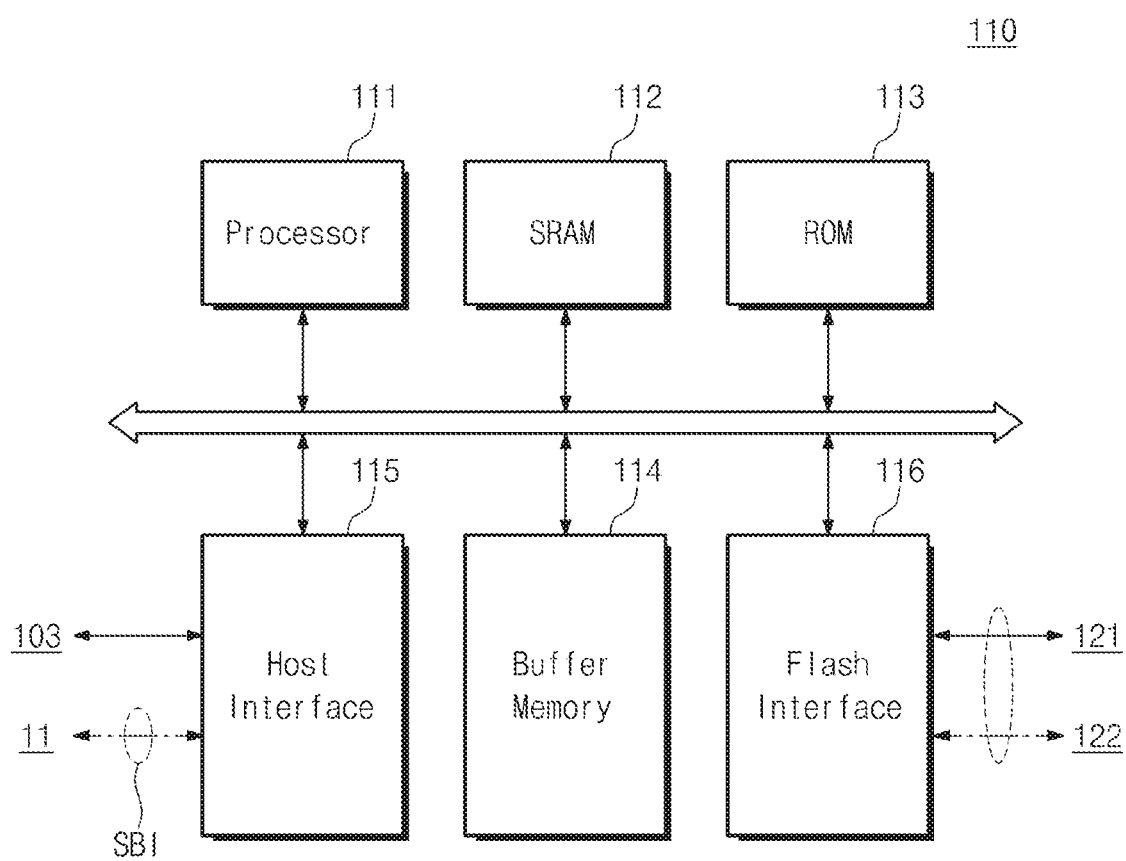
FIG. 4 is a detailed block diagram of a storage controller in FIG. 1.

FIG. 4 is a detailed block diagram of the storage controller 110 in FIG. 1. Referring to FIGS. 1 and 4, the storage controller 110 includes a processor 111, an SRAM 112, a ROM 113, a buffer memory 114, a host interface 115, and a flash interface 116.

The processor 111 may control the overall operation of the storage controller 110. The SRAM 112 may be used as a cache memory, a main memory or the like of the storage controller 110. The ROM 112 may store various information used to and/or required to operate the storage controller 110 in the form of firmware. In example embodiments, data, information or firmware stored in the SRAM 112 or the ROM 113 may be managed or executed by the processor 111.

The buffer memory 114 may temporarily store information, a program, write data or read data used to and/or required to operate the storage controller 110. In example embodiments, the self-diagnosis firmware (SDFW) and the normal firmware (NFW) described with reference to FIG. 1 may be loaded from the first and second nonvolatile memory devices 120 and 130 to be temporarily stored in the buffer memory 114. In example embodiments, the self-diagnosis firmware (SDFW) and the normal firmware (NFW) stored in the buffer memory 114 may be executed by the processor 111.

The storage controller 110 may communicate with the CPU 101 or the chipset 103 through the host interface 115. In example embodiments, the host interface 115 may provide at least one of various interfaces such as universal serial bus (USB), multimedia card (MMC), embedded-MMC, peripheral component interconnection (PCI), PCI express, advanced technology attachment (ATA), serial-ATA, parallel-ATA, small computer small interface (SCSI), enhanced small disk interface (ESDI), integrated drive electronics (IDE), Firewire, universal flash storage (UFS), etc. In example embodiments, the host interface 115 may include a sideband interface (SBI) and the storage controller 110 may communicate with the external device 11 through the host interface 115. Although not shown in the drawings, the storage controller 110 may communicate with the external device 11 through a separate communication channel.

The storage controller 110 may communicate with the first and second nonvolatile memory devices 120 and 130 through the flash interface 116.

Figure 5:
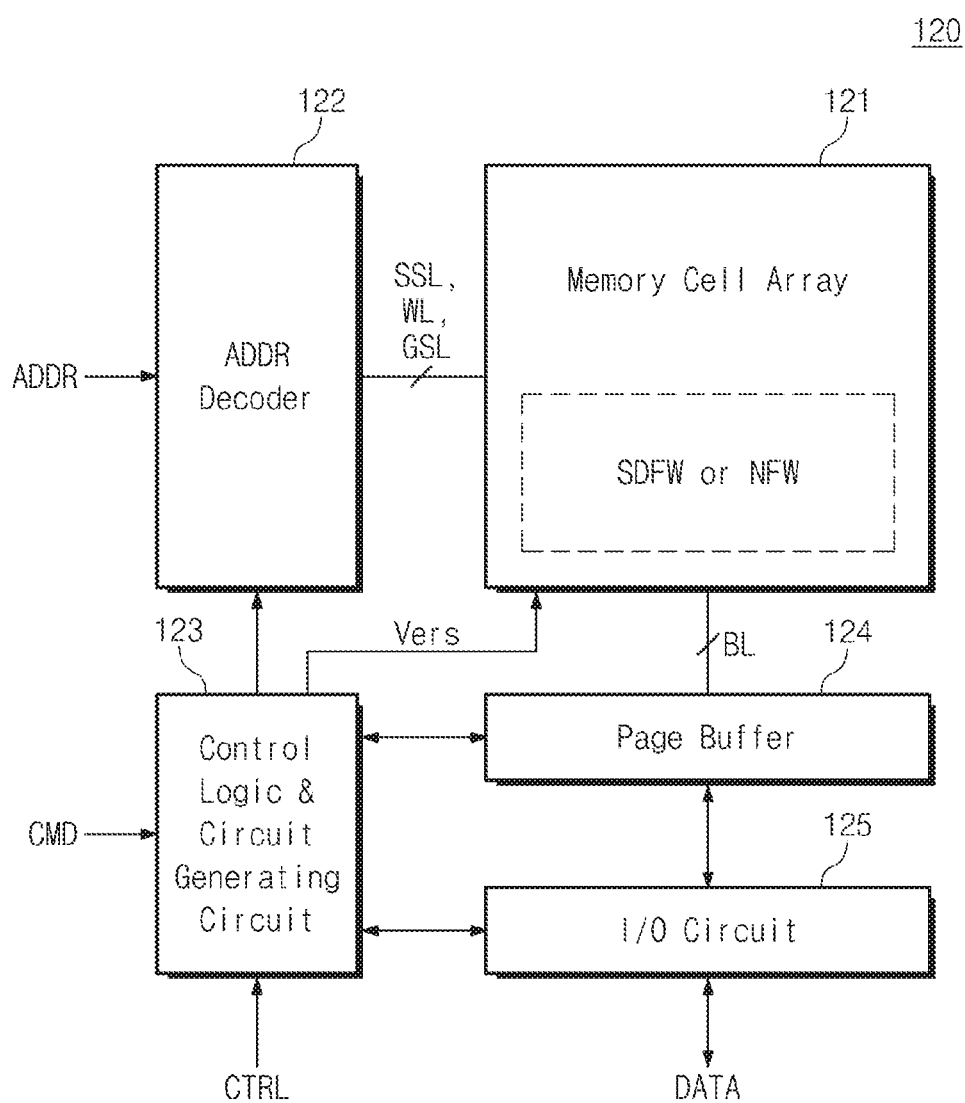
FIG. 5 is a detailed block diagram of a first nonvolatile memory device in FIG. 1.

FIG. 5 is a detailed block diagram of the first nonvolatile memory device 120 in FIG. 1. The second nonvolatile memory device 130 may have the same structure as the first nonvolatile memory device 130. Although the first nonvolatile memory device 120 will be described with reference to FIG. 5, example embodiments of inventive concepts are not limited to the first nonvolatile memory device 120 and the second nonvolatile memory device 130 or other nonvolatile memory devices may have a similar structure to the first nonvolatile memory device in FIG. 5.

Referring to FIGS. 1 and 5, the first nonvolatile memory device 120 may include a memory cell array 121, an address decoder 122, a control logic and voltage generating circuit 123, a page buffer 124, and an input/output (I/O) circuit 125.

The memory cell array 121 may include a plurality of memory blocks. Each of the memory blocks may include a plurality of memory cells. The plurality of memory cells may be connected to a plurality of word lines WL, respectively. Each of the memory cells may be provided as a single-level cell (SLC) storing one bit of data or a multi-level cell (MLC) storing at least two bits of data. In example embodiments, self-diagnosis firmware (SDFW) or normal firmware (NFW) may be stored in some regions of the memory cell array 121.

The address decoder 122 may be connected to the memory cell array 121 through a plurality of word lines WL, string selection lines SSL, and ground selection lines GSL. The address decoder 122 may receive an address ADDR from the storage controller 110 and decode the received address ADDR. The address decoder 122 may decode the address ADDR received from the storage controller 110 and select at least one of the word lines WL based on the decoded address ADDR to control the selected at least one word line.

The control logic and voltage generating circuit 123 may receive a command CMD and a control signal CTRL from the storage controller 110 and control the address decoder 122, the page buffer 124, and the I/O circuit 125 in response to received signals. For example, the control logic and voltage generating circuit 123 may control the address decoder 122, the page buffer 124, and the I/O circuit 125 to write data DATA received from the storage controller 110 into the memory cell array 121 or to read data stored in the memory cell array 121.

The control logic and voltage generating circuit 123 may generate various voltages used to and/or required to operate the first nonvolatile memory device 120. For example, the control logic and voltage generating circuit 123 may generate various voltages such as a plurality of program voltages, a plurality of pass voltages, a plurality of selected read voltages, a plurality of unselected read voltages, a plurality of erase voltages, and a plurality of verify voltages.

The page buffer is connected to the memory cell array 121 through a plurality of bit lines BL. The page buffer 124 may control the bit lines BL based on the data DATA received from the I/O circuit 125 under the control of the control logic and voltage generating circuit 123. In example embodiments, the page buffer 124 may receive data from the I/O circuit 125 in units of pages or read data from the memory cell array 121 in units of pages. In example embodiments, the page buffer 124 may include data latch to temporarily store data read from the memory cell array 121 or data received from the I/O circuit 125.

The I/O circuit 125 may receive data DATA from an external device and transmit the received data DATA to the page buffer 124. Alternatively, the I/O circuit 125 may receive data DATA from the page buffer 124 and transmit the received data DATA to an external device. In example embodiments, the I/O circuit 125 may transmit/receive data DATA to/from an external device in synchronization with a control signal CTRL.

In example embodiments, the first nonvolatile memory device 120, second nonvolatile memory device 130, and/or other nonvolatile memory devices may be embodied to include a three dimensional (3D) memory array for the memory cell array 121. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array. In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 6:
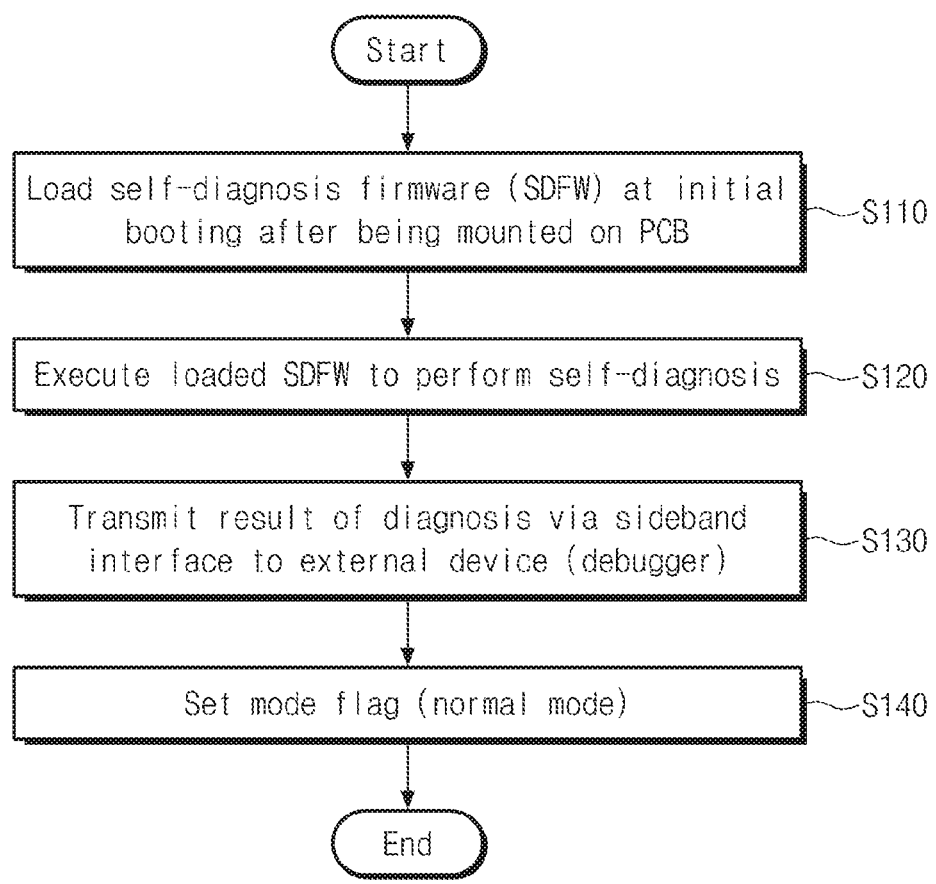
FIG. 6 is a flowchart summarizing the operation of the storage device in FIG. 2.

FIG. 6 is a flowchart summarizing the operation of the storage device in FIG. 2. In example embodiments, the storage device 100 may perform self-diagnosis based on the flowchart in FIG. 6.

Referring to FIGS. 2 and 6, in operation S110, the storage device 100 loads self-diagnosis firmware (SDFW) at initial booting after being mounted on the PCB. For example, the storage controller 110 and the first and second nonvolatile memory devices 120 and 130 of the storage device 100 are mounted on the PCB, as described with reference to FIGS. 2 and 3. At this point, the storage device 100 may be connected to the external device (e.g., debugger) to detect a fault of the storage device 100 (more specifically, a fault that occurs during assembling). The storage device 100 may be initially booted after being mounted on the PCB according to the control of the external device 11. At this point, the storage controller 110 may load the self-diagnosis firmware (SDFW) stored in the first nonvolatile memory device 120. In example embodiments, the loaded self-diagnosis firmware (SDFW) may be stored in the buffer memory 114.

In operation S120, the storage device 100 may execute the loaded self-diagnosis firmware (SDFW) to perform self-diagnosis. For example, the storage controller 110 may write diagnosis data into the first and second nonvolatile memory devices 120 and 130, read the written diagnosis data, and compare original diagnosis data with the read diagnosis data to diagnose states of the first and second nonvolatile memory devices 120 and 130. Alternatively, or in addition, the storage controller 110 may check a connection state of a sensor or the power management integrated circuit 107 via a sideband interface (e.g., I2C interface). The power management integrated circuit 107 may be mounted on the PCB. In example embodiments, the storage device 100 may detect a fault of the storage device 100 through self-diagnosis.

In operation S130, the storage device 100 transmits a self-diagnosis result to the external device 10 through the sideband interface (SBI). For example, the storage device 100 may be connected to the external device 11 through the sideband interface (SBI), as described with reference to FIG. 2. The storage controller 110 may transmit the self-diagnosis result in the operation S120 to the external device 11 through the sideband interface (SBI). In example embodiments, the external device 11 may determine whether the storage device 100 is faulty based on the self-diagnosis result received through the sideband interface (SBI).

In operation S140, the storage device 100 may set a mode flag to a normal mode. In example embodiments, the mode flag may include information on an operation mode of the storage device 100. For example, the storage device 100 may operate in a self-diagnosis mode for performing self-diagnosis or a normal mode for performing a normal operation. The mode flag may include information on the self-diagnosis mode or the normal mode. In example embodiments, the mode flag may include a separate register (not shown) in the storage controller 110. The mode flag may be set by the external device 11 or the processor 111 of the storage controller 110.

Figure 7:
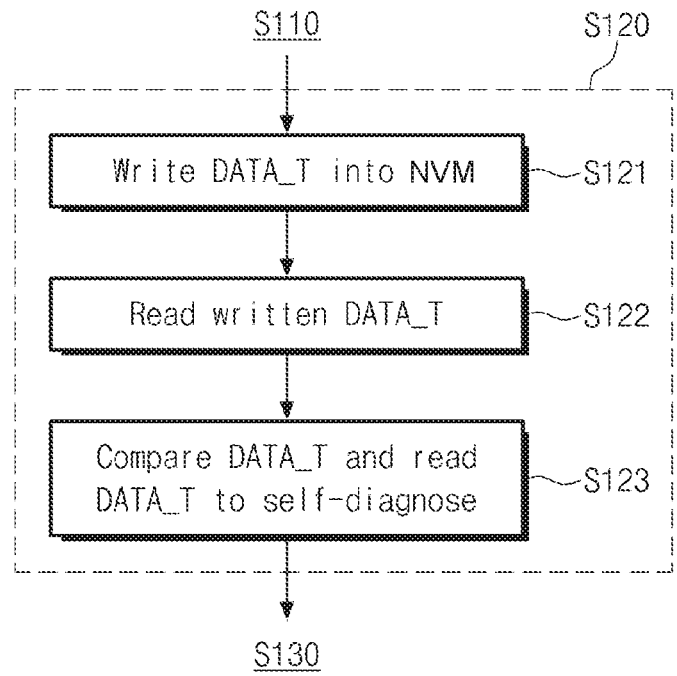
FIGS. 7 and 8 are flowcharts summarizing S120 in FIG. 6.
Figure 8:
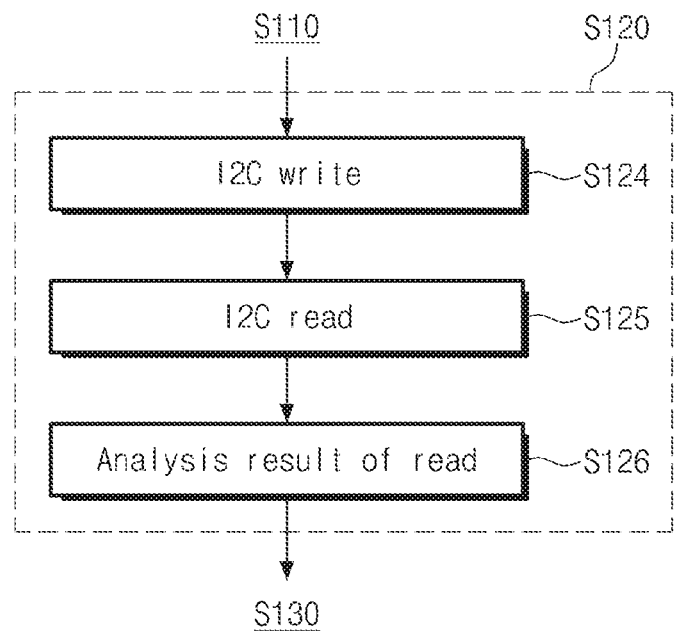

FIGS. 7 and 8 are flowcharts summarizing the S120 in FIG. 6. In example embodiments, an operation method for detecting a fault of the first and second nonvolatile memory devices 120 and 130 will be described with reference to FIG. 7 and an operation method for checking a connection state of a sensor, an external device or a power management integrated circuit connected to the storage device 100 will be described with reference to FIG. 8.

Referring to FIGS. 2 and 7, the S120 includes operations S121 to S123. In example embodiments, the operations S121 to S123 may be operations to detect a fault of the first and second nonvolatile memory devices 120 and 130 or operations to detect a fault of a connection state between the storage controller 110 and each of the first and second nonvolatile memory devices 120 and 130.

In the operation S121, the storage controller 110 may write diagnosis data DATA_T into the first and second nonvolatile memory devices 120 and 130. In example embodiments, the diagnosis data DATA_T may be all-zero data, specific pattern data or random data.

In the operation S122, the storage controller 110 may read the diagnosis data DATA_T written into the first and second nonvolatile memory devices 120 and 130.

In the operation S123, the storage controller 110 may compare the diagnosis data DATA_T read from the first and second nonvolatile memory devices 120 and 130 with original diagnosis data. For example, when the storage controller 110 and the first and second nonvolatile memory devices 120 and 130 operate normally (e.g., they are not faulty), the diagnosis data DATA_T may be normally written into the first and second nonvolatile memory devices 120 and 130 and the diagnosis data DATA_T written into the first and/or second nonvolatile memory devices 120 and 130 may be normally read or may include a correctable error. The symbol NVM in S121 is used as an abbreviation for the first and/or second nonvolatile memory devices 120 and 130. In example embodiments, the correctable error may be corrected by an error correction circuit (not shown) included in the storage controller 110. That is, the original diagnosis data and the read diagnosis data may be substantially identical to each other. In this case, the storage controller 110 may transmit "NORMAL or PASS" to the external device 11 as a self-diagnosis result.

On the other hand, when the storage controller 110 and the first and second nonvolatile memory devices 120 and 130 do not operate normally due to poor connection, an internal error or the like (e.g., they are faulty), the diagnosis data DATA_T may not be written normally into the first and second nonvolatile memory devices 120 and 130 or the diagnosis data written into the nonvolatile memory devices 120 and 130 may not be read normally. In this case, the original data and the read diagnosis data may be different from each other. In this case, the storage controller 110 may transmit "FAULTY" to the external device 11 as a self-diagnosis result.

In example embodiments, the storage controller 110 may transmit the read diagnosis data to the external device 11 and the external device 11 may determine whether the storage device 100 is faulty based on the received diagnosis data.

As described above, the storage controller 110 may write the diagnosis data DATA_T into the first and second nonvolatile memory devices 120 and 130, read the written diagnosis data, and compare the read diagnosis data with original diagnosis data to detect a fault of the storage device 100. In example embodiments, the storage controller 110 may transmit the self-diagnosis result (e.g., whether there is a fault) to the external device 11 through the sideband interface (SBI).

In example embodiments, the storage device 100 may operate based on a plurality of operation modes or a plurality of operation frequencies. The plurality of operation modes indicate operation modes depending on a read or write mode. The storage controller 110 may perform the self-diagnosis described with reference to FIG. 7 on each of the operation modes or the operation frequencies. That is, the storage controller 110 may repeatedly perform the self-diagnosis by changing the operation mode or the operation frequency.

Now, the operation method for checking a connection state of a sensor, an external device or a power management integrated circuit connected to the storage device 100 will be described with reference to FIGS. 2 and 8. For brevity of description, an example will be described where the storage device 100 checks a state of connection to the power management integrated circuit 107. However, example embodiments of inventive concepts are not limited to the example and the storage device 100 may checks states of connection to hardware components such as another external device and a sensor during self-diagnosis.

Referring to FIGS. 2 and 8, the operation S120 may include operations S124 to S126. In the operation S124, the storage controller 110 may perform an I2C write operation on the power management integrated circuit 107. For example, the storage controller 110 and the power management integrated circuit 107 may be connected to each other based on an I2C bus. That is, the storage controller 110 and the power management integrated circuit 107 may communicate with each other through the I2C bus. The power management integrated circuit 107 may include a register including operation mode information. The storage controller 110 may perform the I2C write operation on a register of the power management integrated circuit 107. That is, the storage controller 110 may perform the I2C write operation to perform an operation mode of the power management integrated circuit 107. The power management integrated circuit 107 may supply power depending on the operation mode changed by the storage controller 110 to the storage device 100.

In the operation S125, the storage controller 110 may perform an I2C read operation from the power management integrated circuit 107. For example, for the operation S124, the storage controller 110 may write information on the operation mode into the register of the power management integrated circuit 107. The storage controller 110 may receive a response from the power management integrated circuit 107 through the I2C read operation. In example embodiments, the response of the power management integrated circuit 107 may be a response to the I2C write operation in the operation S124 or information on the operation mode written into the register.

In the operation S124, the storage controller 110 may analyze the response received from the power management integrated circuit 107. For example, the storage controller 110 may determine whether the response received from the power management integrated circuit 107 is a normal response or not a normal response.

In example embodiments, although not shown in the drawings, the storage controller 110 may set the operation mode of the power management integrated circuit 107 through the I2C write operation and determine whether the power supplied from the power management integrated circuit 107 is normal power to diagnose a state of connection to the power management integrated circuit 107.

In example embodiments, the storage controller 110 may execute self-diagnosis firmware (SDFW) to perform the operation described with reference to FIGS. 7 and 8.

The operations described with reference to FIGS. 7 and 8 are merely non-limiting examples and example embodiments of inventive concepts are not limited to the operations. For example, the storage controller 110 may diagnose a state or a connection state of the first and second nonvolatile memory devices 120 and 130 or external devices through various methods other than the operations described with reference to FIGS. 7 and 8.

According to example embodiments, the processor 111 may be a hardware processor such as a central processing unit (CPU), a controller, or an application-specific integrated circuit (ASIC), but example embodiments are not limited thereto. In example embodiments, the self-diagnosis firmware (SDFW) and the normal firmware (NFW) stored in the buffer memory 114 may be executed by the processor 111, thereby configuring the processor 111 as a special-purpose processor 111 for performing one or more of the above-described operations of the storage controller 110. For example, the storage device 100 may execute self-diagnosis firmware (SDFW) at initial booting after being mounted on the PCB to diagnose states and connection states of components included in the storage device 100 and/or connected to the storage device 100. The storage device 100 may transmit a self-diagnosis result to an external device 11 (e.g., debugger) through a sideband interface SBI. The external device 11 may determine whether the storage device 100 is faulty based on the self-diagnosis result. During assembling of the computing system 10, a fault of the storage device 100 is detected to reduce a fault rate of the storage device 100. Thus, the storage device 100 with improved reliability and reduced cost is provided.

Figure 9:
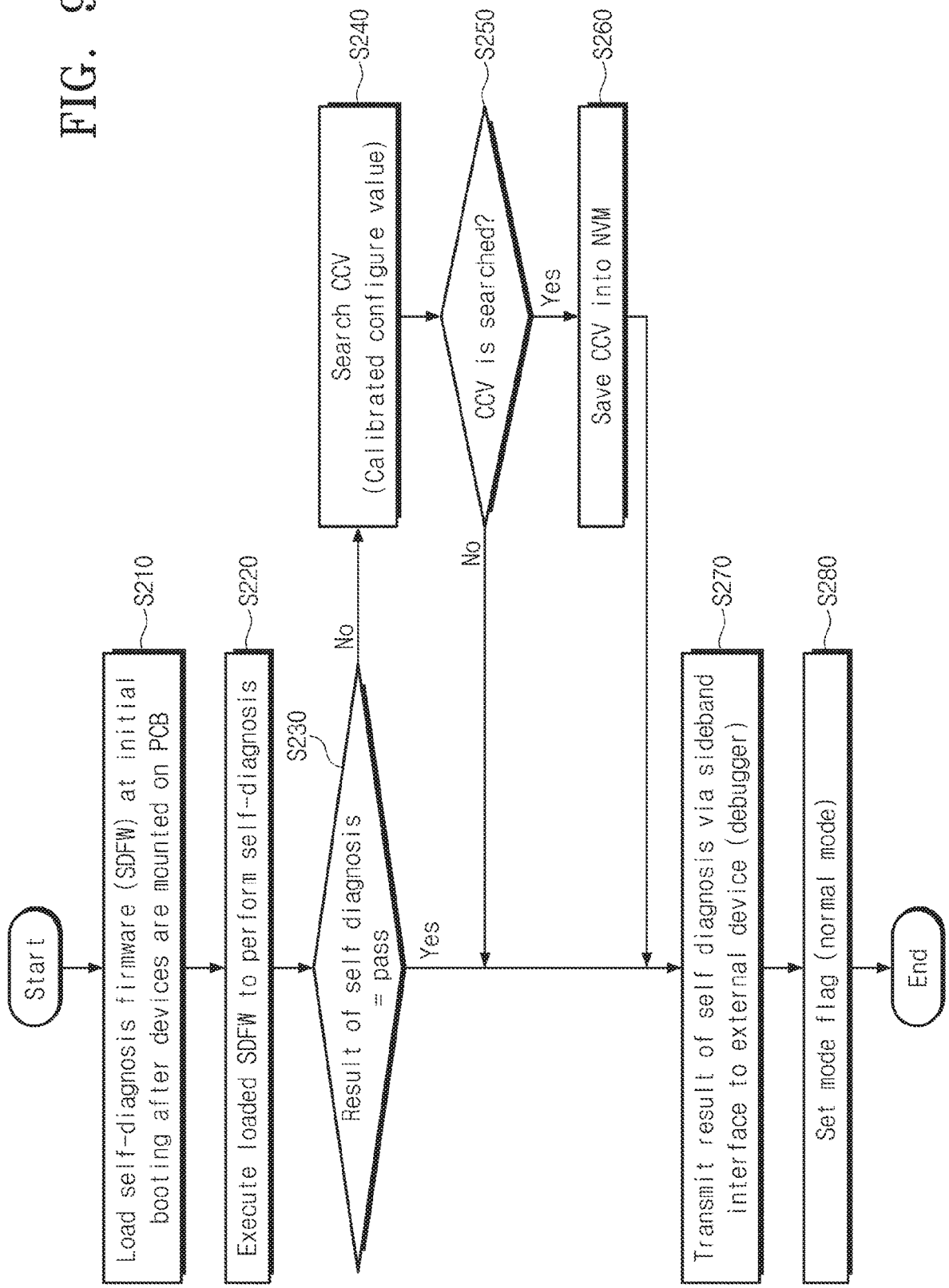
FIG. 9 is a flowchart summarizing the operation of a storage device according to example embodiments of inventive concepts.

The processor 111 may be configured to perform additional operations. For example, FIG. 9 is a flowchart summarizing the operation of the storage device 100 according to example embodiments of inventive concepts. Referring to FIGS. 2 and 9, the storage device 100 may perform operations S210 and S220. The operations S210 and S220 are similar to the operations S110 and S120 in FIG. 6 and will not be described in further detail.

In operation S230, the storage device 100 may determine whether a self-diagnosis result is "PASS". For example, when the fault of the storage device 100 is not detected by the self-diagnosis in the operation S220, the self-diagnosis result may be "PASS".

When the self-diagnosis result is "PASS", the storage device 100 may perform the operations S270 and S280. The operations S270 and S280 are similar to the operations S130 and S140 in FIG. 6 and will not described in further detail.

When the self-diagnosis result is not "PASS", e.g., a fault is detected, the storage device 100 may search a calibrated configuration value (CCV) in the operation S240. The calibrated configuration value may be searched using the external device 11. For example, the external device 11 may store the calibrated configuration value (CCV). The calibrated configuration value (CCV) may be stored in another location, such as the ROM 113 or even a portion of the first nonvolatile memory device 120 and/or a portion of the second nonvolatile memory device 130. In example embodiments, the calibrated configuration value (CCV) indicates hardware configuration values of the storage controller 110 and the first and second nonvolatile memory devices 120 and 130. In example embodiments, the hardware configuration values indicate environment variables, which may be adjusted in the operations of the storage controller 110 and the first and second nonvolatile memory devices 120 and 130, such as an operation frequency, a clock delay value, a read margin, and/or a write margin.

In example embodiments, the storage controller 110 may adjust a delay value of signals received from the first nonvolatile memory device 120 or transmitted to the first nonvolatile memory device 120 to normally write diagnosis data DATA_T into the first nonvolatile memory device 120 or to normally read the diagnosis data DATA_T from the first nonvolatile memory device 120. Alternatively, the storage controller 110 may adjust a read margin or a write margin to normally write the diagnosis data DATA_T into the first nonvolatile memory device 120 or to normally read the diagnosis data DATA_T from the first nonvolatile memory device 120.

The above-described CCV searching method is merely an example and example embodiments of inventive concepts are not limited thereto. The storage device 100 may search a calibrated configuration value (CCV) through various operations.

In the operation S250, the storage device 100 may determine whether the calibrated configuration value (CCV) is searched. For example, the storage controller 110 may perform the operation S240 to search the calibrated configuration value (CCV). Meanwhile, the calibrated configuration value (CCV) may not be searched due to a fatal fault of the storage controller 110, the first nonvolatile memory device 120 or the second nonvolatile memory device 130. In this case, there may be a faulty that is not recovered even by adjusting a hardware configuration value of the storage controller 110, the first nonvolatile memory device 120 or the second nonvolatile memory device 130. At this point, the storage may transmit, to the external device 11, a self-diagnosis result to indicate that there is the faulty.

When the calibrated configuration value (CCV) is searched, the storage device 10 may store information on the calibrated configuration value (CCV) in the first nonvolatile memory device 120 or the second nonvolatile memory device 130 in operation S260. In example embodiments, during a subsequent normal operation, the storage controller 110 may adjust the hardware configuration value of the storage controller 110, the first nonvolatile memory device 120 or the second nonvolatile memory device 130 based on the information stored in the first nonvolatile memory device 120 or the second nonvolatile memory device 130. In example embodiments, calibrated configuration values (CCVs) for respective hardware components (e.g., the storage controller 110 and the first and second nonvolatile memory devices 120 and 130) may be different from each other. For example, a read margin value of the first nonvolatile memory device 120 may be set to a first value and a read margin value of the second nonvolatile memory device 130 may be set to a second value different from the first value. That is, the calibrated configuration values (CCVs) for the respective hardware components may be searched independently of each other.

After the operation S260, the storage device 100 may perform operations S270 and S280.

According to example embodiments, during assembling of the computing system 10, the storage device 100 may perform self-diagnosis to detect whether there is a fault and to search a calibrated configuration value (CCV). The storage device 100 may store the calibrated configuration value (CCV) in the first and second nonvolatile memory devices 120 and 130. Then, the storage device 100 may adjust hardware configuration values of the storage controller 110 and/or the first and second nonvolatile memory devices 120 and/or 130 based on the calibrated configuration value (CCV). Thus, a storage device with improved reliability is provided.

Figure 10:
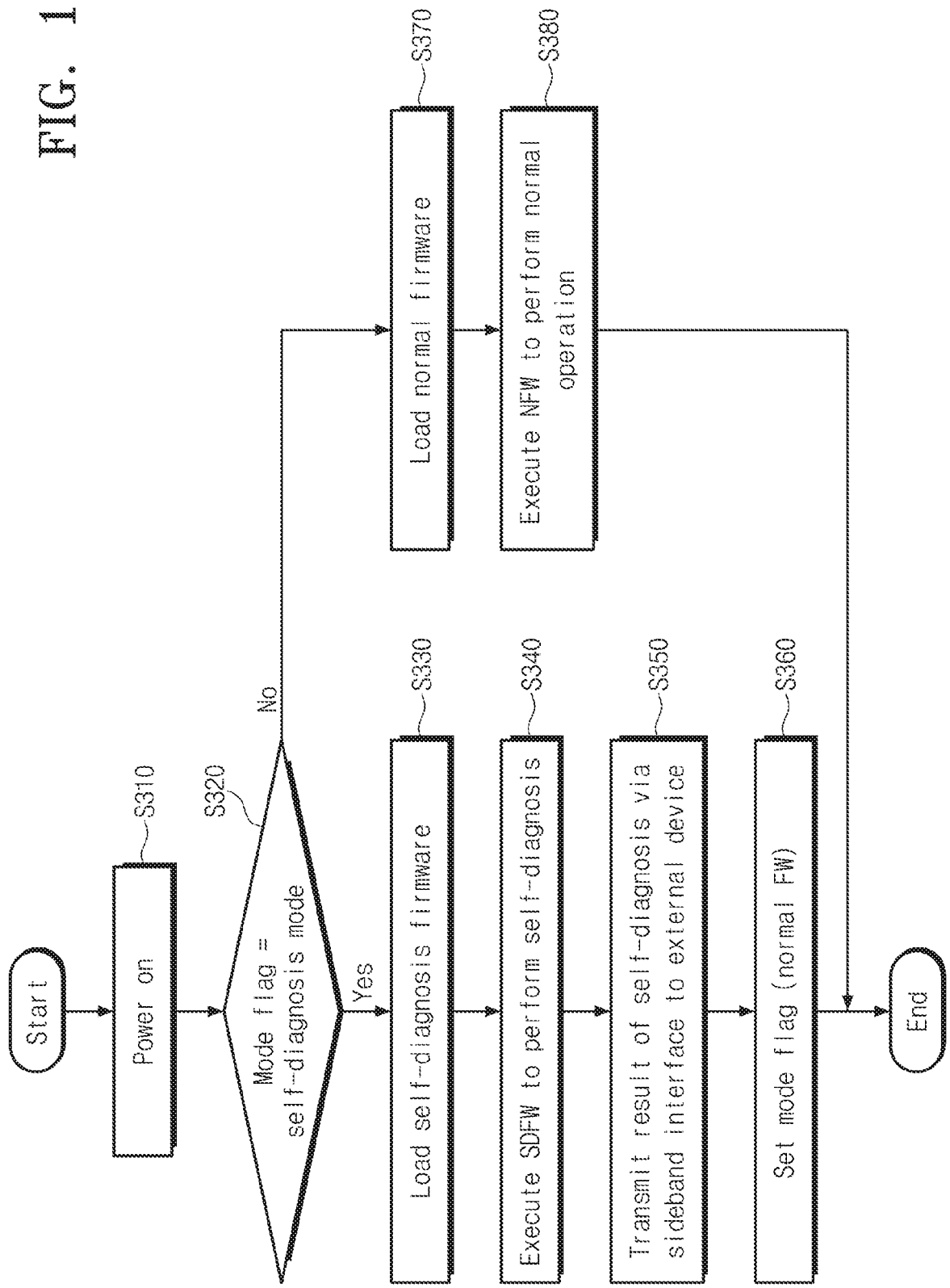
FIG. 10 is a flowchart summarizing the operation of a storage device according to example embodiments of inventive concepts.

FIG. 10 is a flowchart summarizing the operation of a storage device according to example embodiments of inventive concepts. In example embodiments, a self-diagnosis operation when a computing system 10 is used by a user will be described with reference to FIG. 10.

Referring to FIGS. 1 and 10, in operation S310, the storage device 100 is powered on.

In operation S320, the storage device 100 determines whether a mode flag is in a normal mode. For example, the storage controller 110 may include a separate storage device (register (not shown)) including the mode flag. The mode flag may include information indicating an operation mode of the storage device 100.

When the mode flag is in a self-diagnosis mode, the storage device 100 may perform operations S330 to S360. The operations S330 to S360 are similar to the operations S110 to S140 in FIG. 6 and will not be described in further detail. In example embodiments, when the mode flag is in the self-diagnosis mode, the storage device 100 may perform self-diagnosis to search a calibrated configuration value (CCV), as described with reference to FIG. 9.

When the mode flag is not in the self-diagnosis mode (e.g., the mode flag is in the normal mode), the storage device 100 loads normal firmware NFW. For example, the storage device 100 may load normal firmware NFW stored in the second nonvolatile memory device 120. The normal firmware NFW may include information and a program used to and/or required to operate the storage device 100. In example embodiments, the normal firmware NFW may include a flash translation layer FTL.

In operation S370, the storage controller 110 may load the normal firmware (NFW) stored in the second nonvolatile memory device 130. The loaded normal firmware (NFW) may be stored in the buffer memory 114. In operation S380, the storage device 100 may execute the loaded normal firmware to perform a normal operation. In example embodiments, the loaded normal firmware NFW may be stored in the buffer memory 114 (see FIG. 4) and the normal firmware NFW stored in the buffer memory 114 may be executed by the processor 111 (see FIG. 4). In example embodiments, the normal operation may indicate an operation in which data is read or written by the control of the CPU 101 or the normal firmware NFW.

According to example embodiments, the storage device 100 may perform a self-diagnosis or normal operation according to a mode flag. That is, when a fault of the storage device 100 occurs while the computing system 10 is driven, the self-diagnosis operation may be performed on the storage device 100 by changing the mode flag into a self-diagnosis mode. Thus, a storage device with improved reliability is provided.

Figure 11:
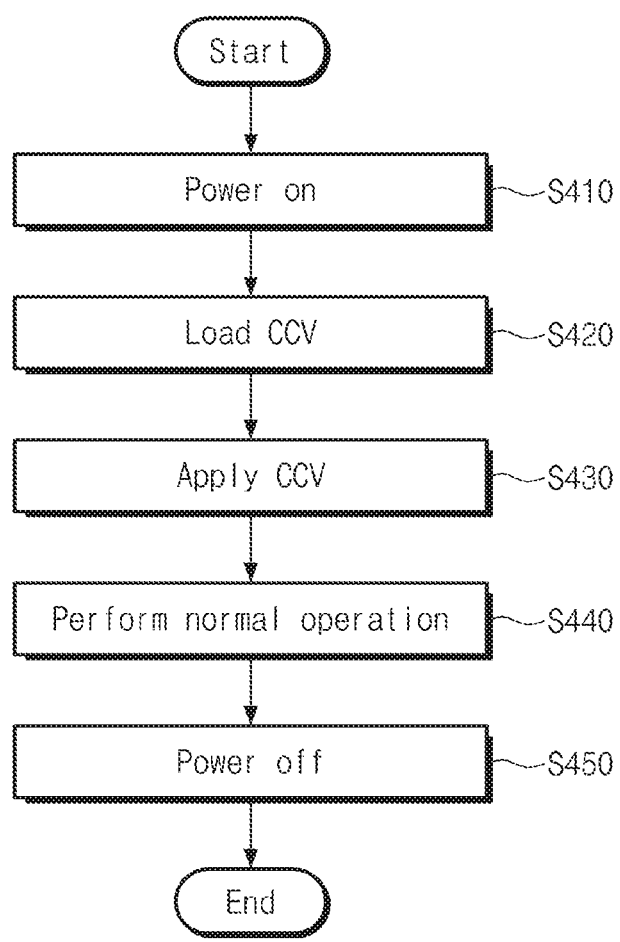
FIG. 11 is a flowchart summarizing the operation of a storage device according to example embodiments of inventive concepts.

FIG. 11 is a flowchart summarizing the operation of the storage device 100 according to example embodiments of inventive concepts. In example embodiments, the operation shown in FIG. 11 may be a part of a normal operation of the storage device 100. Referring to FIGS. 1 and 11, in operation S410, the storage device 100 may be powered on.

In operation S420, the storage device 100 may load a calibrated configuration value (CCV). For example, the first and second nonvolatile memory devices 120 and 130 may include information on the calibrated configuration value (CCV), as described with reference to FIG. 9. The storage controller 110 may load the information on the calibrated configuration value (CCV).

In operation S430, the storage device 100 may adjust hardware configuration values of the storage controller 110 and the first and second nonvolatile memory devices 120 and 130 based on the loaded calibrated configuration value (CCV). For example, the storage controller 110 may adjust hardware configuration values such as a delay value of signals provided from the first and second nonvolatile memory devices 120 and 130, a delay value of signals provided to the first and second nonvolatile memory devices 120 and 130, a read margin, and a write margin, based on the calibrated configuration value (CCV).

In operation S440, the storage device 100 performs a normal operation. For example, after adjusting the hardware configuration values of the storage controller 110 and the first and second nonvolatile memory devices 120 and 130 based on the calibrated configuration value (CCV), the storage device 100 may load normal firmware NFW and drive the loaded normal firmware NFW to perform the normal operation.

In operation S450, the storage device 100 may be powered off.

According to the example embodiments, a calibrated configuration value (CCV) searched through self-diagnosis is applied to each hardware component during a normal operation to improve reliability of the storage device 100.

Figure 12:
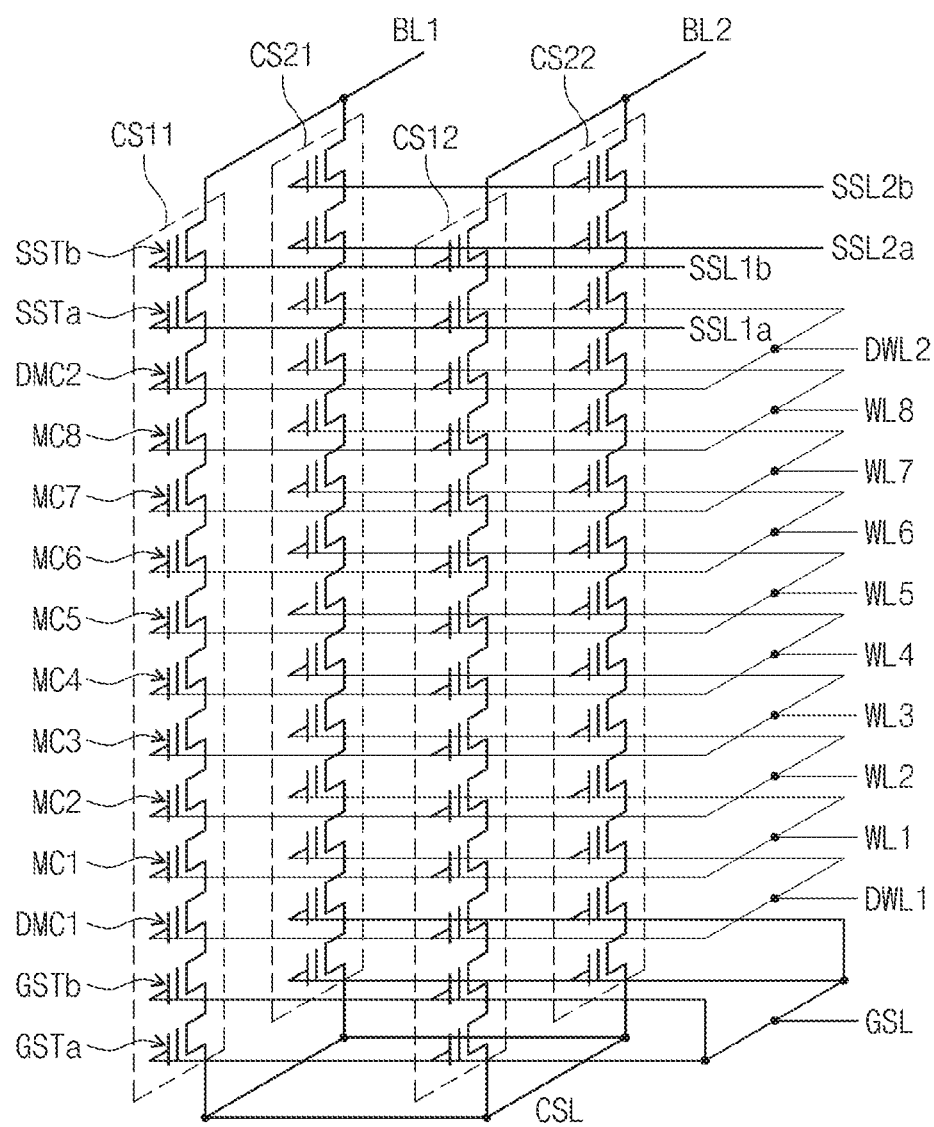
FIG. 12 is a circuit diagram illustrating an example of a first memory block among memory blocks included in a memory cell array in FIG. 5.

FIG. 12 is a circuit diagram illustrating an example of a first memory block among memory blocks included in a memory cell array in FIG. 5. In example embodiments, a first memory block BLK1 of a three-dimensional structure will be described with reference to FIG. 12. However, example embodiments of inventive concepts are not limited to the first memory block BLK1 and other memory blocks may have a similar structure to the first memory block BLK1.

Figure 13:
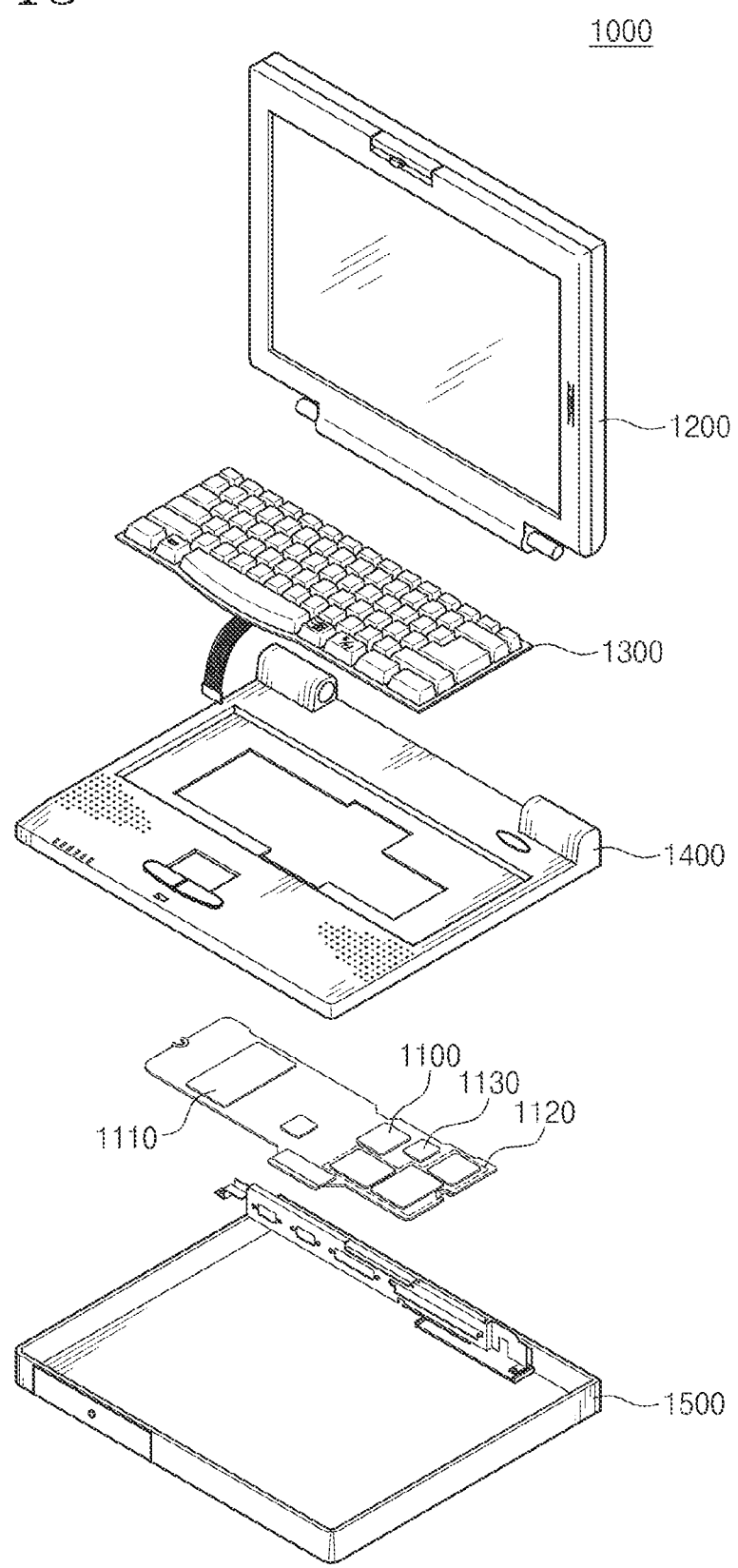
FIG. 13 is an example diagram of a computing system to which a storage device according to example embodiments of inventive concept is applied.

Referring to FIG. 13, the memory block BLK1 includes a plurality of cell strings CS11, CS21, CS12, and CS22. The cell strings CS11, CS21, CS12, and CS22 may be arranged in a row direction and a column direction to form rows and columns. For example, the cell strings CS11 and CS12 may be connected to string selection lines SSL1a and SSL1b to form a first row. The cell strings CS21 and CS22 may be connected to string selection lines SSL2a and SSL2b to form a second row. For example, the cell strings CS11 and CS21 may be connected to a first bit line BL1 to form a first column. The cell strings CS12 and CS22 may be connected to a second bit line BL2 to form a second column.

Each of the cell strings CS11, CS12, CS21, and CS22 includes a plurality of cell transistors. For example, each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. In example embodiments, each of a plurality of cell transistors included in the cell strings CS11, CS12, CS21, and CS22 may be a charge trap flash (CTF) memory cell.

The memory cells MC1 to MC8 are connected in series and are stacked in a height direction perpendicular to a substrate formed by a row direction and a column direction. The string selection transistors SSTa and SSTb are connected in series. The serially connected string selection transistors SSTa and SSTb are provided between the memory cells MC1 to MC8 and a bit line BL. The ground selection transistors GSTa and GSTb are connected in series. The serially connected ground selection transistors GSTa and GSTb are provided between the memory cells MC1 to MC8 and a common source line CSL.

In example embodiments, a first dummy memory cell DMC1 may be provided between the memory cells MC1 to MC8 and the ground selection transistors GSTa and GSTb. In example embodiments, a second dummy memory cell DMC2 may be provided between the memory cells MC1 to MC8 and the string selection transistors SSTa and SSTb.

The ground selection transistors GSTa and GSTb of the cell strings CS11, CS12, CS21, and CS22 may be commonly connected to a ground selection line GSL. In example embodiments, ground selection transistors of the same row may be connected to the same ground selection line and ground selection transistors of a different row may be connected to a different ground selection line. For example, the first ground selection transistor GSTa of the cell strings CS11 and CS12 of a first row may be connected to a first ground selection line and the first ground selection transistor GSTa of the cell strings CS21 and CS22 of a second row may be connected to a second ground selection line.

In example embodiments, although not shown in the drawing, ground selection transistors provided at the same height from a substrate (not shown) may be connected to the same ground selection line and ground selection transistors provided at different heights from the substrate may be connected to different ground selection lines. For example, first ground selection transistors GSTa of the cell strings CS11, CS12, CS21, and CS22 may be connected to a first ground selection line and second ground selection transistors GSTb of the cell strings CS11, CS12, CS21, and CS22 may be connected to a second ground selection line.

Memory cells of the same height from a substrate (or the ground selection transistors GSTa and GSTb) are commonly connected to the same word line, and memory cells of different heights from the substrate (or the ground selection transistors GSTa and GSTb) are connected to different word lines. For example, first to eighth memory cells MC1 to MC8 of the cells strings CS11, CS12, CS21, and CS22 are commonly connected to first to eighth word lines WL1 to WL8, respectively.

Among the first string selection transistors SSTa of the same height, string selection transistors of the same row are connected to the same string selection line and string selection transistors of different rows are connected to different string selection lines. For example, the first string selection transistors SSTa of the cell strings CS11 and CS12 of the first row are commonly connected to a string selection line SSL1a and the first string selection transistors SSTa of the cell strings CS21 and CS22 of the second row are connected to the string selection line SSL1a.

Similarly, among the second string selection transistors SSTb of the same height, string selection transistors of the same height are connected to the same string selection line and string selection transistors of different rows are connected to different string selection lines. For example, the string selection transistors SSTb of the cell strings CS11 and CS12 of the first row are commonly connected to a string selection line SSL1b and the string selection transistors SSTb of the cell strings CS21 and CS22 of the second row are commonly connected to the string selection line SSL2b.

Although not shown in the drawing, string selection transistors of cell strings of the same row may be commonly connected to the same string selection line. For example, the first and second string selection transistors SSTa and SSTb of the cell strings CS11 and CS12 of the first row may be commonly connected to the same string selection line. The first and second string selection transistors SSTa and SSTb of the cell strings CS21 and CS22 of the second row may be commonly connected to the same string selection line.

In example embodiments, dummy memory cells of the same height are connected to the same dummy word line and dummy memory cells of different heights are connected to different dummy word lines. For example, the first dummy memory cells DMC1 are connected to a first dummy word line DWL1 and second dummy memory cells DMC2 are connected to a second dummy word line DWL2.

In the first memory block BLK1, read and write operations may be performed in units of rows. For example, a single row of a memory block BLKa may be selected by the string selection lines SSL1a, SSL1b, SSL2a, and SSL2b.

For example, when the string selection lines SSL1a and SSL1b are supplied with a turn-on voltage and the string selection lines SSL2a and SSL2b are supplied with a turn-off voltage, the cell strings CS11 and CS12 of the first row are connected to the bitlines BL1 and BL2. When the string selection lines SSL2a and SSL2b are supplied with a turn-on voltage and the string selection lines SSL1a SSL1b are supplied with a turn-off voltage, the cell strings CS21 and CS22 of the second row are connected to the bitlines BL1 and BL2 to be driven. Among memory cells of a cell string of a row driven by driving a word line, memory cells of the same height are selected. Read and write operation may be performed on the selected memory cells. The selected memory cells may form a physical page unit.

In the first memory block BLK1, an erase operation may be performed in units of memory blocks or sub-blocks. When an erase operation is performed in units of memory blocks, all memory cells MC of the first memory block BLK1 may be simultaneously erased according to a single erase request. When an erase operation is performed in units of sub-blocks, some of memory cells MC of the first memory block BLK1 may be simultaneously erased according to a single erase request and the other memory cells may be erase-inhibited. A word line connected to the erased memory cells may be supplied with a low voltage (e.g., ground voltage), and a word line connected to the erase-inhibited memory cells may be floated.

In example embodiments, the first memory block BLK1 shown in FIG. 12 is merely an example, the number of cell strings may increase or decrease, and the number of rows and columns constituted by cell strings may increase or decrease according to the number of the cell strings. Moreover, the number of cell transistors GSTS, MC, DMC, SST, and the like of the first memory block BLK1 may increase or decrease, and height of the first memory block BLK1 may increase or decrease according to the number of the cell transistors. The number of lines GSL, WL, DWL, SSL, and the like connected to the cell transistors may increase or decrease according to the number of the cell transistors.

FIG. 13 is an example diagram of a computing system 1000 to which a storage device according to example embodiments of inventive concept may be applied. In example embodiments, the computing system 1000 may be a laptop computer. As illustrated, the computing system 1000 includes a mainboard 1100, a monitor 1200, a keyboard 1300, a top plate 1400, and a bottom plate 1500.

The monitor 1200 may be provided on a surface of the top plate 1400 and may be connected to the mainboard 1100 through a flexible printed circuit board (PCB). The monitor 1200 may output an image signal provided from the mainboard 1100.

The keyboard 1300 may be disposed on the top plate 1400 and may be connected to the mainboard 1100 through the flexible PCB.

The mainboard 1100 may be provided between the top plate 1400 and the bottom plate 1500. As described above, the mainboard 1100 may include various hardware used to and/or required to operate the computing system 1000. For example, a semiconductor package such as a central processing unit (CPU) 1110, a storage device 1120, and a memory 1130, a hardware circuit, and the like may be mounted on the mainboard 1100.

In example embodiments, the storage device 1120 may be identical to the storage device 100 described with reference to FIGS. 1 to 12. The storage device 1120 may be an on-board SSD. The storage device 1120 may perform self-diagnosis based on the operating method described with reference to FIGS. 1 to 12. In example embodiments, the storage device 1120 may transmit a self-diagnosis result to an external device through a sideband interface.

Figure 14:
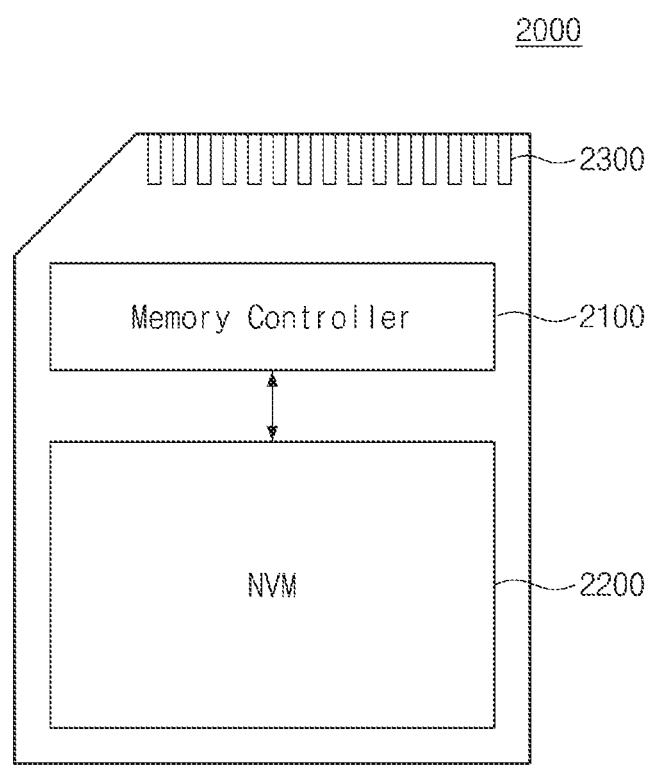
FIG. 14 is a block diagram of a memory card system to which a nonvolatile memory system according to example embodiments of inventive concepts is applied.

FIG. 14 is a block diagram of a memory card system 2000 to which a nonvolatile memory system according to example embodiments of inventive concepts may be applied. As illustrated, the memory card system includes a controller 2100, a nonvolatile memory 2200, and a connector 2300.

The controller 2100 is connected to a nonvolatile memory 2200. The controller 2100 is configured to access the nonvolatile memory 2200. For example, the controller 2100 is configured to control read, write, erase, and background operations of the nonvolatile memory 2200. The background operation includes operations such as wear-leveling management and garbage collection.

The controller 2100 is configured to provide interfacing between the nonvolatile memory 2200 and a host. The controller 2100 is configured to drive firmware for controlling the nonvolatile memory device 2200. In example embodiments, the controller 2100 may drive self-diagnosis firmware (SDFW) described with reference to FIGS. 1 to 13.

In example embodiments, the controller 2100 may include elements such as a random access memory (RAM), a processing unit, a host interface, a memory interface, and an error correction unit.

The controller 2100 communicates with an external device through the connector 2300. The controller 2100 communicates with an external device according to a particular communication protocol. For example, the controller 2100 may communicate with the external device through at least one of various interface protocols such as, but not limited to, USB (Universal Serial Bus), MMC (multimedia card), eMMC (embeded MMC), PCI (peripheral component interconnection), PCI-E (PCI-express), ATA (Advanced Technology Attachment), Serial-ATA, Parallel-ATA, SCSI (small computer small interface), ESDI (enhanced small disk interface), IDE (Integrated Drive Electronics), Firewire, UFS (Universal Flash Storage), NVMe (Nonvolatile Memory express).

The nonvolatile memory 4200 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In example embodiments, the controller 2100 and the nonvolatile memory device 2200 may be integrated into a single semiconductor device. In example embodiments, the controller 2100 and the non-volatile memory device 2200 may be integrated into a single semiconductor device to constitute a solid state drive (SSD). The controller 2100 and the non-volatile memory device 2200 may be integrated into a single semiconductor device to constitute a memory card. For example, The controller 2100 and the non-volatile memory device 2200 may be integrated into a single semiconductor device to constitute a memory card such as a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

The nonvolatile memory device 2200 or the memory card system 1000 may be mounted in various types of packages. For example, the nonvolatile memory device 2200 or the memory card system 1000 may be packaged by one of a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline package (TSOP), a system in package (SIP), a multi-chip package (MCP), a wafer-level fabricated package (WFP), and a wafer-level processed stack package (WSP).

In example embodiments, a package of the controller 2100 or the nonvolatile memory 2200 may be mounted on a printed circuit board (PCB). After the controller 2100 or the nonvolatile memory 2200 is mounted on the PCB, the controller 2100 and the nonvolatile memory 2200 may perform a self-diagnosis or normal operation, as described with reference to FIGS. 6 to 11.

Figure 15:
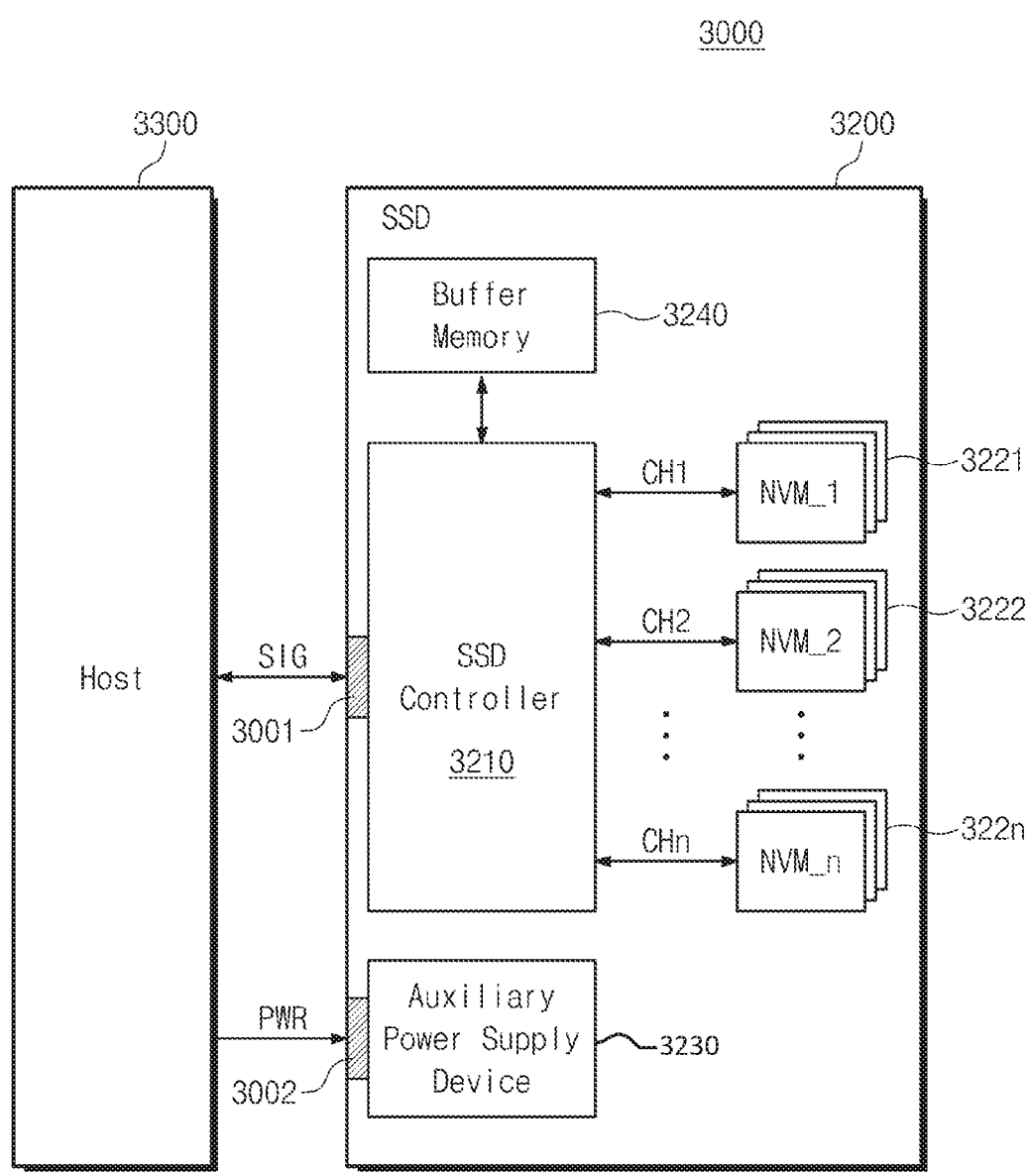
FIG. 15 is a block diagram of a solid state drive (SSD) system to which a storage device according to example embodiments of inventive concepts is applied.

FIG. 15 is a block diagram of a solid state drive (SSD) system 3000 to which a storage device according to example embodiments of inventive concepts may be applied. As illustrated, the SSD system 3000 includes a host 3100 and an SSD 3200. The SSD 3200 transmits/receives a signal SIG to/from the host 3100 using a signal connector 3001 and may receive power PWR via a power connector 3002. The SSD 3200 includes an SSD controller 3210, a plurality of flash memories 3221 to 322*n*, an auxiliary power supply 3230, and a buffer memory 3240.

The SSD controller 3210 may control the flash memories 3221 to 322*n* in response to the signal SIG received from the host 3100. The flash memories 3221 to 322*n* may perform a program operation according to the control of the SSD controller 3210.

The auxiliary power supply 3230 is connected to the host 3100 via the power connector 3002. The auxiliary power supply 3230 may receive the power PWR from the host 3100 to be charged. The auxiliary power supply 3230 may supply power of the SSD system 3000 when power is not sufficiently supplied from the host 3100. In example embodiments, the auxiliary power supply 3230 may be disposed inside or outside the SSD 3200. For example, the auxiliary power supply 3230 may be disposed at a main board and may supply auxiliary power to the SSD 3200.

The buffer memory 3240 operates as a buffer memory of the SSD 3200. For example, the buffer memory 3240 may temporarily store data received from the host 3100 or data received from the flash memories 3221 to 322*n* or may temporarily store metadata (e.g., mapping table) of the flash memories 3221 to 322*n*. The buffer memory 3240 may include a nonvolatile memory such as DRAM, SDRAM, DDR SDRAM, LPDDR SDRAM, and SRAM or a nonvolatile memory such as FRAM ReRAM, STT-MRAM, and PRAM.

In example embodiments, components included in the SSD system 3000 may be implemented with semiconductor packages, respectively and each of the semiconductor packages may be mounted on a printed circuit board (PCB). After each of the semiconductor packages is mounted on the PCB, the SSD system 3000 may a self-diagnosis or normal operation, as described with reference to FIGS. 6 to 11.

Figure 16:
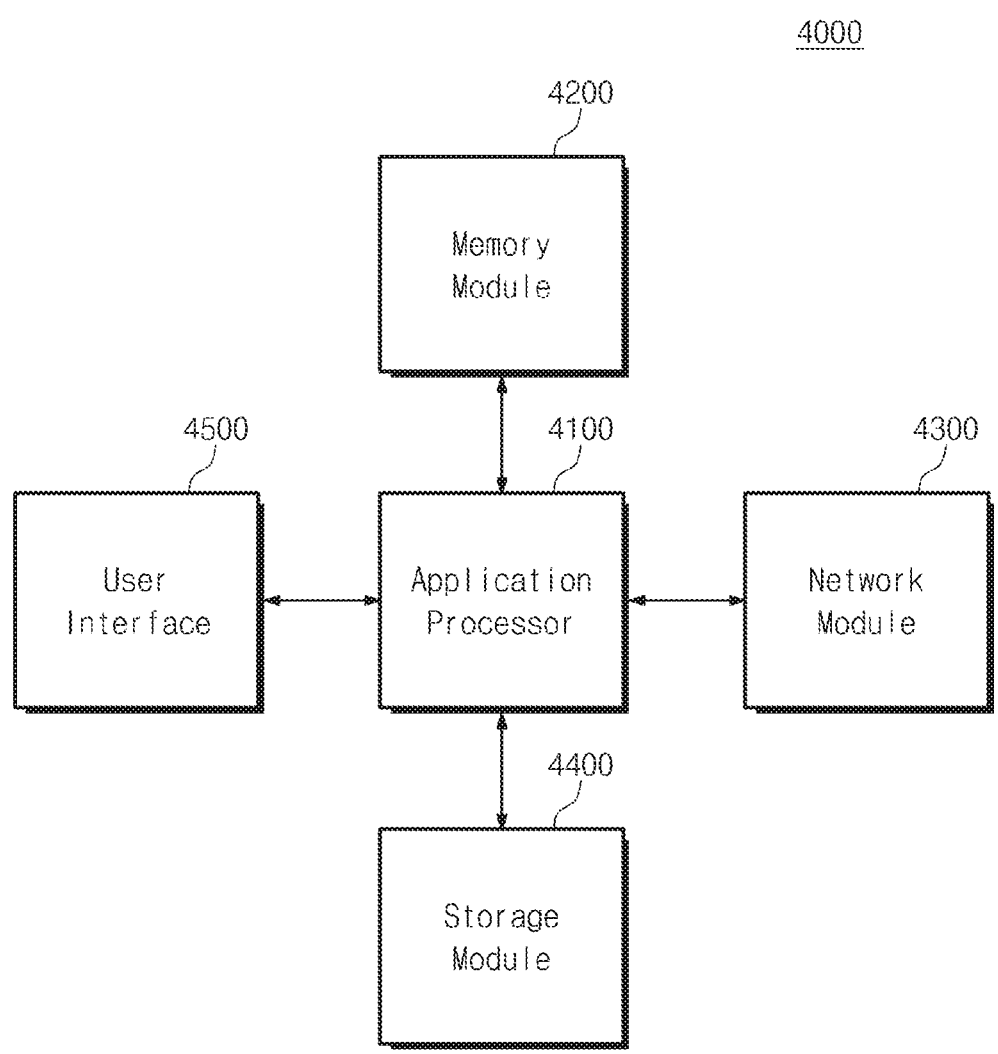
FIG. 16 is a block diagram of a user system to which a storage device according to example embodiments of inventive concepts is applied.

FIG. 16 is a block diagram of a user system to which a storage device according to example embodiments of inventive concepts may be applied. As illustrated, the user system 4000 includes an application processor 4100, a memory module 4200, a network module 4300, a storage module 4400, and a user interface 4500.

The application processor 4100 may drive components incorporated in the user system 4000, an operating system (OS) or various programs. In example embodiments, the application processor 4100 may include controllers to control components incorporated in the user system 4000, interfaces, a graphic engine, and the like. The application processor 4100 may be provided as a system-on-chip (SoC).

The memory module 4200 may operate as a main memory, a working memory, a buffer memory or a cache memory of the user system 4000. The memory module 4200 may include a volatile random access memory such as DRAM, SDRAM, DDR SDRAM, DDR2 SDRAM, DDR3 SDRAM, LPDDR DRAM, LPDDR2 DRAM, LPDDR3, and DRAM and a nonvolatile random access memory such as PRAM, ReRAM, MRAM, and FRAM. In example embodiments, the memory module 4200 and the application processor 4100 may be packed using package-on-package (PoP).

The network module 4300 may communicate with external devices. In example embodiments, the network module 4300 may support wireless communication such as CDMA (Code Division Multiple Access), GSM (Global System for Mobile communication), WCDMA (wideband CDMA), CDMA-2000, TDMA (Time Division Multiple Access), LTE (Long Term Evolution), Wimax, WLAN, UWB, Bluetooth, and WI-DI. In example embodiments, the network module 4300 may be included in the application processor 4100. The network module 4300 may also, or alternatively, support wired communication.

The storage module 4400 may store data. For example, the storage module 4400 may store data received from the application processor 4100. Alternatively, the storage module 4400 may transmit its stored data to the application processor 4100. In example embodiments, the storage module 4400 may be implemented using a semiconductor memory device such as a phase-change RAM (PRAM), a magnetic RAM (MRAM), a resistive RAM (RRAM), a NAND flash memory, a NOR flash memory, and a three-dimensional NAND flash memory.

In example embodiments, the storage module 4400 may the storage device 100 described with reference to FIGS. 1 to 13. The storage module 4400 may be mounted on a separate printed circuit board (PCB) and may perform the self-diagnosis described with reference to FIGS. 1 to 13.

The user interface 4500 may include interfaces to input data or a command to the application processor 4100 or output data to an external device. For example, the user interface device 4500 may include user input interfaces such as a keyboard, a keypad, a button, a touch panel, a touch screen, a touch ball, a touch pad, a camera, a gyroscope sensor, and a vibration sensor. The user interface device 4500 may include user output interfaces such as an liquid crystal display (LCD), an organic light emitting diode (OLED) display, an active matrix OLED (AMOLED) display, an LED, a speaker, and a motor.

According to example embodiments, a storage device may perform self-diagnosis to detect a fault or search a calibrated configuration value (CCV) to overcome the detected fault. The storage device may transmit a self-diagnosis result to an external device (e.g., debugger). The external device may determine whether the storage device is faulty, through the received self-diagnosis result. Accordingly, since a test may be performed on the storage device, a storage device with reduced cost and improved reliability and an operating method of the storage device are provided.

As described above, a storage device may perform self-diagnosis to detect a fault and transmit a result of the self-diagnosis to an external device. In addition, the storage device may perform the self-diagnosis to search a calibrated configuration value to overcome the detected fault. Thus, a storage device with improved reliability and an operating method of the storage device are provided.

Moreover, a fault occurring during assembling of a storage device may be detected to prevent an addition process for the storage device. Thus, a storage device with reduced cost and an operating method of the storage device are provided.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A storage device comprising:

at least one nonvolatile memory device configured to store self-diagnosis firmware; and a storage controller configured to communicate with an external device through a sideband interface, the storage controller being configured to perform self-diagnosis of the storage device using the self-diagnosis firmware according to the control of the external device, at initial booting of the at least one nonvolatile memory device after the at least one nonvolatile memory device and the storage controller are mounted on a printed circuit board, and the storage controller being configured to transmit a result of the self-diagnosis to the external device through the sideband interface, wherein the sideband interface includes at least one of an I2C, a system management bus, and a management component transport protocol (MTCP), wherein the storage device is an on-board solid state drive, wherein the at least one nonvolatile memory device is further configured to store normal firmware, the storage controller is configured to perform a normal operation using the normal firmware at power-on after performing the self-diagnosis, and the storage controller is configured to detect a calibrated configuration value according to the result of the self-diagnosis, the calibrated configuration value includes hardware configuration values of the storage controller and the at least one nonvolatile memory device, during a normal operation, the storage controller is configured to load the calibrated configuration value and to adjust a hardware configuration value of the at least one nonvolatile memory device based on the calibrated configuration value.

2. The storage device as set forth in claim 1, wherein the storage controller is configured to perform the self-diagnosis by writing original diagnosis data into the at least one nonvolatile memory device, reading the original diagnosis data written into the at least one nonvolatile memory device to obtain read diagnosis data, and comparing the read diagnosis data with the original diagnosis data.

3. The storage device as set forth in claim 1, wherein the storage controller is configured to store the calibrated configuration value in the at least one nonvolatile memory device.

4. The storage device as set forth in claim 1, wherein the storage controller is configured to adjust the hardware configuration values of the storage controller and the at least one nonvolatile memory device based on the calibration configuration value such that the hardware configuration values for the storage controller and the at least one nonvolatile memory device are different from each other.

5. The storage device as set forth in claim 1, wherein the storage controller includes a buffer memory, and the storage controller is configured to load the self-diagnosis firmware from the at least one nonvolatile memory device and to store the loaded self-diagnosis firmware in the buffer memory.

6. The storage device as set forth in claim 1, wherein each of the at least one nonvolatile memory device and the storage controller is a separate semiconductor package and is mounted on a printed circuit board, and the at least one nonvolatile memory device and the storage controller are configured to be electrically connected to each other through a plurality of interconnections on the printed circuit board.

7. The storage device as set forth in claim 6, wherein the external device is a debugger device configured to test the storage device, and the storage controller is electrically connected to a central processing unit through a plurality of interconnections on the printed circuit board, and the storage controller is configured to communicate with the central processing unit using on a host interface.

8. The storage device as set forth in claim 1, wherein the at least one nonvolatile memory device includes a three-dimensional memory array.

9. An operating method of a storage device including at least one nonvolatile memory device and a storage controller configured to control the at least one nonvolatile memory device, the operating method comprising:
loading self-diagnosis firmware included in the at least one nonvolatile memory device at initial booting of the storage device using the storage controller after the at least one nonvolatile memory device and the storage controller are mounted on a printed circuit board;
performing self-diagnosis of the storage device, the performing the self-diagnosis including executing the loaded self-diagnosis firmware at the initial booting of the at least one nonvolatile memory device after the at least one nonvolatile memory device and the storage controller are mounted on the printed circuit board; and
transmitting a result of the self-diagnosis to an external device through a sideband interface, wherein
the sideband interface includes at least one of an I2C, a system management bus, and a management component transport protocol (MTCP), wherein
the storage device is an on-board solid state drive,
the storage controller is configured to detect a calibrated configuration value according to the result of the self-diagnosis,
the calibrated configuration value includes hardware configuration values of the storage controller and the at least one nonvolatile memory device, and
during a normal operation, the storage controller is configured to load the calibrated configuration value and to adjust a hardware configuration value of the at least one nonvolatile memory device based on the calibrated configuration value.

10. The operating method as set forth in claim 9, further comprising:
controlling the initial booting of the storage device using the external device.

11. A storage device comprising:
a first nonvolatile memory device configured to store self-diagnosis firmware;
a second nonvolatile memory device configured to store normal firmware; and
a storage controller including a buffer memory,
wherein the storage controller is configured to perform self-diagnosis of the storage device using the self-diagnosis firmware according to the control of an external device, at initial booting of the first nonvolatile memory device and second nonvolatile memory device after the first nonvolatile memory device, second nonvolatile memory device, and the storage controller are mounted on a printed circuit board,
wherein the storage controller is configured to control the storage device in a self-diagnosis mode using the self-diagnosis firmware for performing self-diagnosis of components in the storage device, the storage controller is configured to transmit a result of the self-diagnosis to the external device using a sideband interface, and the storage controller is configured to control the storage device in a normal mode using the normal firmware after performing the self-diagnosis if the storage device does not detect a fatal fault during the self-diagnosis, wherein
the sideband interface includes at least one of an I2C, a system management bus, and a management component transport protocol (MTCP),
the storage device is an on-board solid state drive that includes a circuit board,
the storage controller is configured to detect a calibrated configuration value according to the result of the self-diagnosis,
the calibrated configuration value includes hardware configuration values of the storage controller, the first nonvolatile memory device, and the second nonvolatile memory device, and
during the normal mode, the storage controller is configured to load the calibrated configuration value and to adjust at least one of the hardware configuration values of at least one of the first nonvolatile memory device and the second nonvolatile memory device based on the calibrated configuration value.

12. The storage device of claim 11, wherein
the first nonvolatile memory device, the second nonvolatile memory device, and the storage controller are on the circuit board, and
the storage controller is configured to perform the self-diagnosis by writing diagnosis data into at least one of the first and second nonvolatile memory devices, reading the diagnosis data written into the at least one of the first and second nonvolatile memory devices, and comparing the read diagnosis data with the original diagnosis data.

13. The storage device of claim 11, wherein
the first nonvolatile memory device, the second nonvolatile memory device, and the storage controller are connected to each other on the circuit board, and the storage controller is configured to perform the self-diagnosis by checking a connection state of at least one of a sensor, the external device, and a power management circuit connected to the storage controller.

\* \* \* \* \*